United States Patent
Chen et al.

[19]

[11] Patent Number: 6,009,548
[45] Date of Patent: *Dec. 28, 1999

[54] ERROR CORRECTING CODE RETROFIT METHOD AND APPARATUS FOR MULTIPLE MEMORY CONFIGURATIONS

[75] Inventors: Chin-Long Chen, Fishkill, N.Y.; Timothy Jay Dell, Colchester, Vt.; Wayne C. Kwan, Wappingers Falls, N.Y.

[73] Assignee: International Business Machines Corporation, Armonk, N.Y.

[ * ] Notice: This patent is subject to a terminal disclaimer.

[21] Appl. No.: 09/023,969

[22] Filed: Jun. 18, 1998

Related U.S. Application Data

[62] Division of application No. 08/984,240, Dec. 3, 1997.

[51] Int. Cl.$^6$ .......................... H03M 13/00; G11C 29/00
[52] U.S. Cl. ......................... 714/762; 714/718; 714/763; 714/805
[58] Field of Search .................................. 714/718, 753, 714/757, 758, 761, 762, 763–770, 773, 777, 785, 800, 801, 802–805

[56] References Cited

U.S. PATENT DOCUMENTS

| | | | |
|---|---|---|---|
| 4,277,844 | 7/1981 | Hancock et al. | 714/766 |
| 4,450,561 | 5/1984 | Gotze | 774/757 |
| 5,127,014 | 6/1992 | Raynham | 365/200 |
| 5,263,032 | 11/1993 | Porter et al. | 714/710 |
| 5,278,847 | 1/1994 | Helbig, Sr. et al. | 714/765 |
| 5,343,426 | 8/1994 | Cassidy et al. | 365/189.02 |
| 5,369,650 | 11/1994 | Kirk et al. | 714/753 |
| 5,379,304 | 1/1995 | Dell | 714/773 |
| 5,450,422 | 9/1995 | Dell | 774/763 |
| 5,452,418 | 9/1995 | Tatosian et al. | 711/160 |
| 5,459,742 | 10/1995 | Cassidy et al. | 714/763 |
| 5,465,262 | 11/1995 | Dell | 714/800 |
| 5,490,155 | 2/1996 | Abdoo et al. | 714/785 |
| 5,623,506 | 4/1997 | Dell et al. | 714/773 |

*Primary Examiner*—Emmanuel L. Moise
*Attorney, Agent, or Firm*—Marc A. Ehrlich

[57] ABSTRACT

A method and apparatus are described for providing error correcting code (ECC) which may be incorporated into a computer system which includes one of a plurality of memory configurations and which may include a preexisting error control feature. A data store operation causes the receipt of a word including data bits and check bits generated by a pre-existing error control feature. The data and check bits of the received word are used to generate additional check bits based upon the configuration of the computer system memory. The additionally generated check bits are stored in the memory along with the received word. Upon a subsequent data fetch operation which retrieves the word and check bits the check bits are decoded thereby providing error detection and correction in the retrieved word for single and multiple bit errors including the failure of an entire memory chip. The invention provides 84/72 ECC for computer systems having a four bit per chip memory configuration and 88/72 ECC for computer systems having an eight bit per chip memory configuration. Further embodiments describe the detection and communication of uncorrectable errors.

30 Claims, 8 Drawing Sheets

ERROR CORRECTING CODE RETROFIT METHOD AND APPARATUS FOR MULTIPLE MEMORY CONFIGURATIONS

CROSS-REFERENCE TO RELATED APPLICATION

The present invention is a divisional of U.S. patent application Ser. No. 08/984,240 entitled "Error Correcting Code Retrofit Method and Apparatus For Multiple Memory Configurations" by Chen et al., assigned to the present assignee and filed on Dec. 3, 1997. This patent application is incorporated herein by reference.

FIELD OF THE INVENTION

The present invention is generally related to the field of computer system design, and particularly to the integration of a robust error correcting code mechanism into an existing computer system having one of a number of different memory configurations. Without loss of generality, the invention is particularly suited for incorporation within an existing computer system such as a personal computer having a single error correct error correcting mechanism or parity error control mechanism to provide multiple error detection and correction including chip kill error detection and correction facilities therefor.

BACKGROUND OF THE INVENTION

A variety of factors including faulty components and inadequate design tolerances may result in errors in the data being processed by a computer. These errors also commonly occur during data transmission due to "noise" in the communication channel. As a result of these errors, one or more bits, which may be represented as X, which are to be transmitted within the system, are corrupted so as to be received as /X (i.e. the logical complement of the value of X). In order to protect a computer system against such errors, the data bits may be coded via error correcting code (ECC) in such a way that the errors may be detected and possibly corrected by special ECC logic circuits.

A typical ECC implementation appends a number of check bits to each data word. The appended check bits are used by the ECC logic circuits to detect errors within the data word.

The simplest and most common form of error control is implemented through the use of the parity bit. The single parity bit is appended to the data word and assigned to be either a 0 or a 1, so as to make the number of 1's in the data word even in the case of even parity codes, or odd in the case of odd parity codes.

Prior to the transmission of the data word in a computer system, often upon the initial storage of the data word, the value of the parity bit is computed at the source point and appended to the data word. Upon receipt of the transmitted data word, logic at the destination point recalculates the parity bit and compares it to the received, previously appended parity bit. If the recalculated and received parity bits are not equal a single bit error has been detected. Specifically, this means that a single data bit in the data word has transitioned from its original value, for example 1 to 0 or 0 to 1. If the received and recalculated parity bits are equal, then it can be concluded that such a single bit error did not occur, however multiple bit errors may not be ruled out. For example, if a data bit changes from a 0 to a 1 and another data bit changes from a 1 to a 0 (i.e. a double bit error) the parity of the data word will not change and the error will be undetected. Thus, use of the parity bit provides single error detection, however, it fails to detect every multiple even bit error, and it fails to provide information on the location of the erroneous bit(s).

By appending additional parity bits to the data word, each corresponding to a subset of data bits within the data word, the parity bit concept may be easily expanded to provide the detection of multiple bit errors or to determine the location of single or multiple bit errors. Once a data bit error is located it is a simple matter to cause a logic circuit to correct the located erroneous bit, thereby providing single error correction (SEC). Many single error correction codes have the ability to detect double errors and are thus termed single error correcting double error detecting codes (SEC-DED).

Multiple error detection schemes rely on appending additional check bits to the data word. The most well-known SEC-DED ECC is the so-called Hamming code, which appends a series of check bits to the data word as it is stored in memory. Upon a read operation, the retrieved check bits are compared against recalculated check bits to detect, locate (i.e. correct) a single bit error. By adding more check bits and appropriately overlapping the subsets of data bits represented thereby, other error correcting codes have been devised for providing three bit error detection and two bit error correction, and, via the further addition of check bits, codes can be formulated to detect and correct any number of data bit errors.

The use of such robust forms of ECC has long been recognized as a necessity for the main storage on large computer systems such as the S/390 Parallel Enterprise Server—Generation 3 and the S/390 Parallel Enterprise Server—Generation 4 computer systems available from IBM Corporation (S/390 and IBM are registered trademarks, and S/390 Parallel Enterprise Server is a trademark of IBM Corporation). Since the main storage on such large systems often serves as the central data repository accessed by disparate users throughout an enterprise, the criticality of preserving the integrity of the massive amount of data stored on such large systems is readily apparent. Accordingly, large system customers have long demanded that their systems incorporate a form of multiple error detecting and correcting ECC.

With the advent of the network centric model for computer systems and with the increased power available in relatively small computer systems, the role of the server has increasingly become a shared role, with the traditional high-end mainframe computers operating at one extreme, and small PC-based servers operating at the other extreme. Until recently, small PC-based servers which serve either a departmental, office or workgroup network did not include even rudimentary SEC ECC. Many commercially available PCs still implement parity bit error control schemes, which as previously shown, are not adequate protection against all double bit errors and do not offer any error correction facilities.

Cognizant of the newly created need to provide a more robust ECC to these small scale servers, companies have begun to offer retrofit mechanisms such as ECC-on-SIMM (single in-line memory module) or EOS (available from IBM Corporation) which transparently implements a compatible, self-contained, on-SIMM, SEC ECC into an existing parity PC system. The underlying concepts of EOS are embodied in U.S. Pat. No. 5,623,506, issued to Dell et al., U.S. Pat. No. 5,465,262, issued to Dell et al., U.S. Pat. No. 5,450,422, issued to Dell, and U.S. Pat. No. 5,379,304 issued to Dell et al. Each of the foregoing patents are assigned to IBM Corporation the present assignee hereof and each of the patents are incorporated herein by reference.

With the availability of such products, the server owner may upgrade his/her server to include SEC ECC without having to change the planar/motherboard, memory controller, or operating system software. Additionally, memory controller chip sets which support SEC ECC are becoming increasingly commercially available. Moreover, microprocessor manufacturers are now beginning to offer SEC ECC support in their products such as the Intel Pentium Pro Microprocessor (Intel and Pentium are registered trademarks of Intel Corporation).

While these SEC ECC retrofit products offer increased protection for the PC-based servers, their ECC is limited and will not, for example, correct multiple data bit errors such as would be experienced upon the failure of an entire dynamic random access memory (DRAM) chip, without the addition of special high-end architectural techniques which would prove prohibitively costly for the consumer of PC-servers.

Accordingly, there exists a need for a simple, transparent mechanism by which a user may retrofit a more robust ECC to an existing SEC ECC or parity based computer system. In order for such a solution to prove effective, the mechanism should be cost efficient, and totally compatible with the existing computer system. The retrofit mechanism must enable the correction of an entire DRAM chip failure and preferably would be compatible with commercially available DRAM chips whether organized with four data bits per chip or with eight data bits per chip. Finally, the retrofit mechanism should be provided in an efficient and practical manner that will facilitate easy implementation in a commercially available application specific integrated circuit (ASIC).

With such a solution, a server owner may easily upgrade the ECC for his/her server without undergoing the labor and expense of modifying the processor or controller hardware or changing the operating software therefor. As such, the level of data integrity in the server may be easily scaled in accordance with the storage and access requirements thereof.

SUMMARY OF THE INVENTION

The foregoing problems and shortcomings of the prior art are overcome and further advantageous features are provided by the present invention wherein a method and apparatus for implementing an ECC which is compatible with a 4 data bit per chip, or 8 data bit per chip memory arrangement, in a computer system which may implement a single error control mechanism, is provided for performing error detection and correction on data to be read from one or more memory chips and wherein the ECC implements error detection and correction techniques which enable the detection and correction of single and multiple data bit errors including without limitation entire memory chip failures.

In a preferred embodiment of the invention the ECC logic is included in a commercially available ASIC chip included on a dual in-line memory module (DIMM) card which may be easily installed as a retrofit for an existing computer system memory. The ECC circuits receive data from the system data bus which is typically 2(n)+1 bytes wide (where n is a positive integer) and in a preferred embodiment is 72 bits wide (i.e. 9 bytes). The width of the data bus in this embodiment is calculated so as to include 64 bits (8 bytes) of data and an additional 8 check bits (1 byte) which may be generated by any existing ECC mechanism such as SEC or parity error control within in the computer system. By incorporating the existing check bits into the ECC algorithm, the inventive ECC circuits will successfully perform error correction and detection irrespective of any existing ECC in the computer system thereby allowing a seamless ECC retrofit.

In an embodiment of the invention the ECC apparatus comprises a first I/O buffer for receiving the 72 bits from the system data bus upon the occurrence of a write command in the computer system. The received 72 bits are passed to a check bit generation circuit for generating the check bits required for the inventive ECC. The check bit generator further receives the mode bit which instructs the check bit generator as to whether to generate check bits for a 4 bit or 8 bit memory chip configuration. Thereafter, the received bits along with the generated check bits are passed through a second I/O buffer for storage in the memory chips.

Upon the occurrence of a read instruction in the computer system, the stored 72 bits and the associated check bits are passed from the memory chips back through the second I/O buffer and thereafter to the error detection unit. The error detection unit additionally receives the mode bit which instructs the error detection unit to perform error detection operations based upon either a 4 bit per chip or 8 bit per chip memory configuration. Once instructed, the error detection unit performs the appropriate logic operations to determine whether errors are present in the bits read from memory. The error detection unit further includes logic means for evaluating the location of a detected error within the 72 bit word. Thereafter, the 72 bits are passed to the error correction unit. If an error is detected by the error detection circuit and is capable of correction, a signal is passed from the error detection circuit to the error correction circuit, which in turn performs the necessary logic operations to correct the erroneous bit(s) in the 72 bit word read from the memory chips. After any required correction has been completed the 72 bits are passed from the error correction circuit back through the first I/O stage and back onto the system data bus for use by the computer system.

In a further embodiment of the invention, undetectable errors such as those involving bits which physically reside within separate memory chips may be identified and the computer system informed accordingly.

The present inventive method and apparatus provide a robust ECC which may be seamlessly incorporated into a computer system. Without limitation, the invention may be implemented on computer systems having a pre-existing error control mechanism, and is compatible with a plurality of memory configurations.

BRIEF DESCRIPTION OF THE DRAWINGS

The subject matter which is regarded as the invention is particularly pointed out and distinctly claimed at the conclusion of the specification. The foregoing as well as other features and advantages of the invention will be apparent from the following detailed description in conjunction with the accompanying drawings, in which:

DETAILED DESCRIPTION OF THE PREFERRED EMBODIMENTS OF THE INVENTION

The emerging role of the small to mid-sized PC-based server as a standard element of a networked enterprise has moved such relatively small computer systems, heretofore intended for advanced desktop uses, into the role of the network server, storing data to be accessed by numerous users throughout an enterprise. As the number of users accessing this new type of server has grown, so has the requirement of ensuring the integrity of the data stored therein. Accordingly, the need to upgrade the ECC in existing computer systems in order to detect and correct multiple data bit errors including those multiple data bit errors caused by the failure of an entire single DRAM chip, has recently become an important consideration of network system owners. Thus, the present invention, which provides an expedient ECC solution which may, without limitation, be easily incorporated into a computer system having a pre-existing level of error control, will prove useful to the administrators of networked computer systems comprising one or more relatively small servers which may be PC-based workstations, or mid-range computers.

While the present invention has a practical application as a retrofit ECC for improving the error correction for an existing computer system with single error control means, the invention may additionally prove useful for computer systems having no existing error control mechanism. In particular, use of the present invention in a system with no error control will provide multiple data error detection and correction capabilities including the ability to detect and correct and entire memory chip failure in systems having one of a plurality of memory configurations. For ease of understanding we will focus our detailed description on an embodiment portraying implementation of the present inventive ECC in a computer system having an existing error control mechanism, however it will be apparent, via the ensuing description, that the same techniques and apparatus may be applied to a system having no error control means to provide analogous benefits and advantages therefor.

Figure 1:
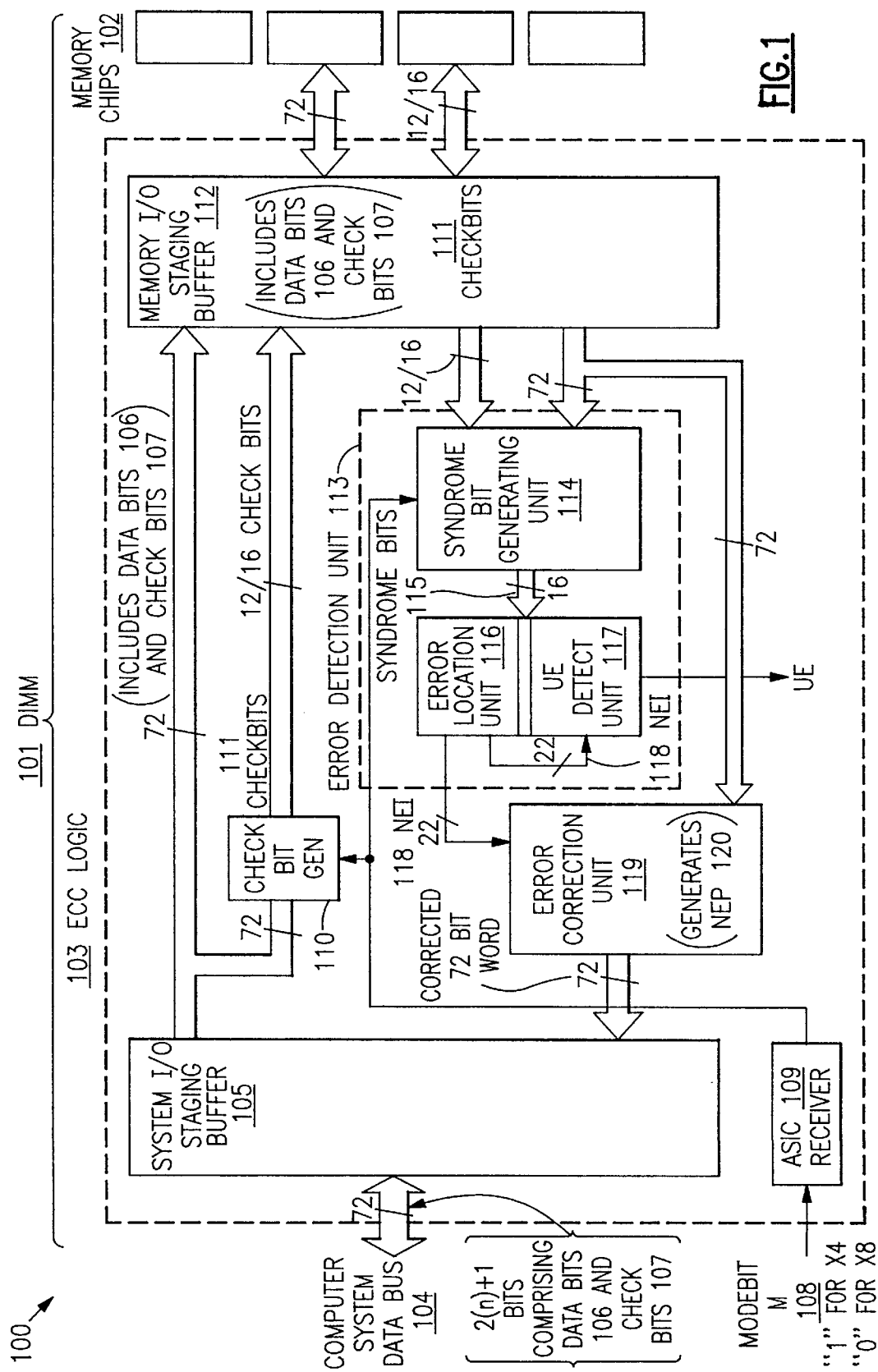
FIG. 1 illustrates an overview of the inventive ECC logic design.

Turning now to our invention in greater detail, reference may be had to FIG. 1 wherein a block diagram 100 generally representing the functional aspects of an embodiment of the present inventive apparatus is shown. The apparatus is preferably included on a dual in-line memory module (DIMM) card 101 along with one or more memory chips 102, and may without limitation, be easily implemented within a commercially available ASIC chip. The ASIC chip would serve to interconnect the data bus 104 of the computer system (not shown) to the memory chips 102 which would typically be DRAMs. In this manner, data passing from the computer system data bus 104 to the memory chips 102 during execution of a write operation would pass through the ECC circuitry 103 on the ASIC prior to storage in the memory chips 102. Likewise, data passing from the memory chips 102 to the computer system data bus 104 during the execution of a read operation would also pass through the ECC circuitry 103 on the ASIC. Accordingly, the error correction mechanism operates on data as it is being stored by the computer system in the memory chips 102 as well as on that same stored data along with check bits as it is being read by the computer system from the memory chips.

Data being passed to the memory chips 102 during a write operation passes first to the system I/O staging buffer 105 within the ASIC chip. The system I/O staging buffer 105 is a bidirectional buffer which controls the data movement in both directions between the computer system data bus 104 and the ECC logic 103. In an embodiment of the invention in which the computer system includes pre-existing error control circuitry, the data received at the system I/O staging buffer 105 would include data bits 106 as well as check bits 107. Typically, for a 64 bit data bus 104 in a system employing single-error control, 8 check bits are generated. In such a system the system I/O staging buffer must be 72 bits wide (i.e. 64 data bits (106)+8 check bits (107)=72 bits). It will be understood herein that the present invention may be implemented in a manner consistent with the present description on any width data bus. Since it is typically the case that a computer system employs 2(n) bytes of data (where n is a positive integer), and would add a byte of check bits to implement its pre-existing error control mechanism, such a computer system providing 2(n)+1 bytes of data and check bits combined could seamlessly incorporate an ECC retrofit in accordance with the present invention.

Upon receipt of the 72 bits from the data bus 104 at the system I/O staging buffer 105, the mode bit 108 is read by the ASIC receiver 109. The mode bit setting, which is preferrably set at the time that the DIMM 101 is assembled, is determined by the type of memory chips 102 that are incorporated onto the DIMM 101. In one embodiment, the mode bit would be tied to Vcc (or would otherwise exhibit a logical level "1" at the ASIC receiver 109) for DIMMs 101 including a 4 bit per chip memory configuration, and would be tied to GND (or would register a logical "0" level at the ASIC receiver 109) for DIMMs 101 including an 8 bit per chip memory configuration.

After receipt of the data from the system data bus 104 and registration at the ASIC receiver 109 of the mode bit 108, the system I/O staging buffer 105 passes the received 72 bits to the check bit generator circuit 110 and to the memory I/O staging buffer 112 for further storage in the memory chips 102.

The check bit generator circuit 110 includes logic, which will subsequently be described, for encoding the 72 bit word including data bits 106 and check bits 107 so as to provide the check bits 111 required for carrying out the inventive ECC for the present invention. Since the inventive error correction mechanism must be able to determine memory chip failures, and since the DIMM may incorporate either 4-bit per chip or 8 bit per chip DRAMS, the check bit generator circuit 110 additionally receives the state of the mode bit from the ASIC receiver 109, which in turn determines which check bit generation encoding is to be performed thereby. For example, and via reference to FIG. 1, if the DIMM 101 includes 4 bit per chip DRAMs, then 12 check bits 111 are generated by the check bit generator 110, and if the DIMM includes 8 bit per chip DRAMs, the check bit generator 110 generates 16 check bits 111 to append to the 72 bit word received from the data bus 104. Thus, in the preferred embodiment incorporating a 72 bit word from the computer system, the invention generates either (88,72) or (84,72) error correcting code depending upon the type of memory chips 102 present in the computer system.

The check bits 111 (either 12 or 16 bits) are in turn passed from the check bit generator 110 to the memory I/O staging buffer 112 along with the 72 bit word. The memory I/O staging buffer 112 is a second bidirectional buffer, which controls the data movement between the ECC logic 103 and the memory chips 102. In a preferred embodiment, the system I/O staging buffer 105 passes the 72 bits received from the system data bus 104 to the memory I/O staging buffer 112 and to the check bit generator 110. Subsequently, the 12 or 16 check bits 111 generated by the check bit generator 110 are passed to the memory I/O staging buffer 112. Once the either 84 or 88 bits have been buffered at the memory I/O staging buffer 112, the buffered word may be stored in the memory chips 102 which are coupled to the staging buffer 112, thereby completing the execution of the write operation.

Upon the subsequent issuance of a read command for the stored data, the 84 or 88 bits are read from the memory chips 102 in which they have been stored, into the memory I/O staging buffer 112. From there, the 12 or 16 check bits 107 and the 72 data bits 106 are passed onto the error detection unit 113. The error detection unit regenerates the check bits 111 based on the 72 bit word and compares the regenerated check bits to the stored check bits to determine whether there are any errors in the data read from the memory chips 102. Once the error determination has been completed, the error detection unit identifies the location of the erroneous bit(s) and notes the occurrence of so-called "uncorrectable errors" (or UEs) as will subsequently be described.

The check bit regeneration and comparison function is carried out within the error detection unit 113 by the syndrome bit generation unit 114. The syndrome bit generation unit 114 provides 16 syndrome bits 115 which indicate whether any single or multiple bit errors have occurred within the 72 bit data word which would include, without limitation, the failure of an entire DRAM chip. Since the generation of the syndrome bits requires the regeneration of the check bits for the 72 bit word, the syndrome generation unit 114, similar to the check bit generation circuit 110 is coupled to the ASIC receiver 109 for sampling the state of the mode bit 108. If the syndrome bits 115 are not all equal to zero then a single or multiple bit error exists. Once the non-zero syndrome bits have been generated they must be decoded to localize the erroneous bit(s) so as to affect error correction.

The decoding of the syndrome bits takes place within the error detection unit 113 in the error location 116 and UE detection 117 units. The syndrome bits 115 generated by the syndrome bit generation unit 114 are passed to the error location unit 116. At the error location unit 116 the 4 bit nibble(s) of the 72 bit data word which contains the detected errors are identified by decoding the syndrome bits 115 into single bit nibble error indicators (NEI) 118 each of which represents a nibble of the 72 bit word. Once the error has been localized it may be corrected via logic operations which are performed within the error correction unit 119.

The UE detection unit 117 within the error detection unit 113 is capable of detecting errors which are incapable of being corrected using the present inventive ECC mechanism. Such uncorrectable errors are within the present ECC mechanism may occur upon the failure of more than one of the memory chips 102. The ability to correct more than a single failed memory chip is achievable within the context of the present invention, however such a robust ECC would require the generation of more check bits which in turn requires further storage capacity of the memory chips 102. Thus, further error correction than described herein is achievable, albeit at an additional cost and is intended to fall within the scope of the present invention. UE detection within the UE detection unit 117 is performed via a logic operation utilizing, inter-alia, the NEIs 118 generated in the error location unit 116.

If the error detection unit 113 identifies a single or multiple bit error in the 72 bit word, the NEI 118 is passed from the error location unit 116 within the error detection unit 113, to the error correction unit 119. The error correction unit also receives the original 72 bit word retrieved from the memory I/O staging buffer 112. Within the error correction unit 119, the NEI 118 is converted into a nibble error pattern 120 which is logically combined with the corresponding data nibble of the 72 bit word which contains the erroneous bit(s) thereby correcting the erroneous bits. The corrected 72 bit word is thereafter passed from the error correction unit 119 back to the system I/O staging buffer 105 and thereafter onto the system data bus 104 from which the data to be read is used by the computer system completing the read operation.

CHECK BIT GENERATION:

With the foregoing overview of the inventive ECC techniques as a background we will now turn to the specific operation of each of the functional blocks therein, including the check bit generation circuit 110, the syndrome bit generation unit 113, the error location unit 116, the UE detection unit 117 and the error correction unit 119.

In order to generate the check bits 111 for the 72 bit word of the preferred embodiment, the exemplary check bit generation circuit 110, employs a 3 row×21 column ($H_1$) and a 4 row×22 column ($H_2$) parity check matrix respectively for the 4 bit per memory chip and 8 bit per memory chips DIMM configurations. The parity check matrices ($H_1$ and $H_2$) are illustrated below in Table 1:

TABLE 1

$H_1 =$

| | | | | | | | | | DATA | | | | | | | | | | ECC | | |
|---|---|---|---|---|---|---|---|---|---|---|---|---|---|---|---|---|---|---|---|---|---|
| D0 | D1 | D2 | D3 | D4 | D5 | D6 | D7 | D8 | D9 | D10 | D11 | D12 | D13 | D14 | D15 | D16 | D17 | | C0 | C1 | C2 |
| I | O | T1 | O | T2 | O | T3 | O | T4 | O | T5 | O | T6 | O | T7 | O | T8 | O | | I | O | O |
| O | I | O | T1 | O | T2 | O | T3 | O | T4 | O | T5 | O | T6 | O | T7 | O | T8 | X | O | I | O |
| I | I | I | I | I | I | I | I | I | I | I | I | I | I | I | I | I | I | | O | O | I |

A. $H_1$ Parity Check Matrix for 4 bit per chip memory arrangement for generation of 12 check bits.

$H_2 =$

| DATA | ECC |
|---|---|

TABLE 1-continued

| D0 | D1 | D2 | D3 | D4 | D5 | D6 | D7 | D8 | D9 | D10 | D11 | D12 | D13 | D14 | D15 | D16 | D17 | | C0 | C1 | C2 | C3 |
|----|----|----|----|----|----|----|----|----|----|-----|-----|-----|-----|-----|-----|-----|-----|---|----|----|----|----|
| I | O | T1 | O | T2 | O | T3 | O | T4 | O | T5 | O | T6 | O | T7 | O | T8 | O | | I | O | O | O |
| O | I | O | T1 | O | T2 | O | T3 | O | T4 | O | T5 | O | T6 | O | T7 | O | T8 | X | O | I | O | O |
| I | O | I | O | I | O | I | O | I | O | I | O | I | O | I | O | I | O | | O | O | I | O |
| O | I | O | I | O | I | O | I | O | I | O | I | O | I | O | I | O | I | | O | O | O | I |

B. $H_2$ Parity Check Matrix for 8 bit per chip memory arrangement for generation of 16 check bits.

In the foregoing tables, matrices $H_1$ and $H_2$ are multiplied by the data bits to generate the check bits 111. In the $H_1$ and $H_2$ matrices, the 18 data headings D0–D17 represent 4-bit nibbles of the 72 bit data word such that D0=data bits 0–3 (i.e. DQ0, DQ1, DQ2, and DQ3) and D17=data bits 68–71 (i.e. DQ68, DQ69, DQ70, and DQ71). Similarly, the ECC headings C0–C2 and C0–C3 in the check bit matrices represent 4-bit nibbles (or check bit vectors) of the check bits to be generated by the check bit generation circuit 110, such that C0=check bits 0–3, C2=check bits 8–11, and C3=check bits 12–15. Of course, in a DIMM including 4 bit per chip DRAMs the check bits 12–15 will be "don't care" values.

In the foregoing matrices each of the "0" values represents a 4×4 matrix of 0's and the "1" values in the matrices represent the identity matrix or a 4×4 matrix, which when multiplied by a data nibble D0–D17 yields the data nibble. For example:

|1 0 0 0|
|0 1 0 0|
|0 0 1 0| * (DQ0, DQ1, DQ2, DQ3) = (DQ0, DQ1, DQ2, DQ3)
|0 0 0 1|

The T values in the $H_1$ and $H_2$ matrices represent the check bit generation matrices (CBGs) as listed below in Table 2:

TABLE 2

| T1: | \|0 0 0 1\|<br>\|1 0 0 1\|<br>\|0 1 0 0\|<br>\|0 0 1 0\| | T2: | \|0 0 1 0\|<br>\|0 0 1 1\|<br>\|1 0 0 1\|<br>\|0 1 0 0\| | T3: | \|0 1 0 0\|<br>\|0 1 1 0\|<br>\|0 0 1 1\|<br>\|1 0 0 1\| | T4: | \|1 0 0 1\|<br>\|1 1 0 1\|<br>\|0 1 1 0\|<br>\|0 0 1 1\| |
| T5: | \|0 0 1 1\|<br>\|1 0 1 0\|<br>\|1 1 0 1\|<br>\|0 1 1 0\| | T6: | \|0 1 1 0\|<br>\|0 1 0 1\|<br>\|1 0 1 0\|<br>\|1 1 0 1\| | T7: | \|1 1 1 0\|<br>\|0 0 0 1\|<br>\|1 0 0 0\|<br>\|1 1 0 0\| | T8: | \|1 1 0 0\|<br>\|0 0 1 0\|<br>\|0 0 0 1\|<br>\|1 0 0 0\| |

Based upon the parity check matrix multiplication presented above, the generation of check bits for the present invention may be explained via a two-step combinatorial process. In the first step, parity vectors P0–P3 are generated in accordance with the multiplication of the parity check matrices with the data bits to yield:

$P0=D0+(T1)D2+(T2)D4+(T3)D6+(T4)D8+(T5)D10+(T6)D12+(T7)D14+(T8)D16$ $P1=D1+(T1)D3+(T2)D5+(T3)D7+(T4)D9+(T5)D11+(T6)D13+(T7)D15+(T8)D17$ $P2=D0+D2+D4+D6+D8+D10+D12+D14+D16$ $P3=D1+D3+D5+D7+D9+D11+D13+D15+D17$

Wherein the "+" indicates an exclusive OR (XOR) operation.

Each of the parity vectors P0–P3 is a 4-bit nibble, wherein P0 consists of 4 bits (P0(0), P0(1), P0(2) and P0(3)) and so on. Accordingly, each of the foregoing parity vector equations may be expanded into a set of four equations. By way of example, for P0:

$P0(0)=DQ0+DQ11+DQ18+DQ25+DQ32+DQ35+DQ42+DQ43$
$+DQ49+DQ50+DQ56+DQ57+DQ58+DQ64+DQ65;$ $P0(1)=DQ1+DQ8+DQ11+DQ18+DQ19+DQ25+DQ26+DQ32$
$+DQ33+DQ35+DQ40+DQ42+DQ49+DQ51+DQ59+DQ66;$ $P0(2)=DQ2+DQ9+DQ16+DQ19+DQ26+DQ27+DQ33+DQ34$
$+DQ40+DQ41+DQ43+DQ48+DQ50+DQ56+DQ67;$ $P0(3)=DQ3+DQ10+DQ17+DQ24+DQ27+DQ34+DQ35+DQ41$
$+DQ42+DQ48+DQ49+DQ51+DQ56+DQ57+DQ64.$

The same expansion may be carried out for P1, P2 and P3.

From these parity vectors, the set of 16 check bits 111 (12 for the 4 bit per chip DRAM DIMMs) included in the 4-bit nibbles (or check bit vectors) C0–C3 may be generated based upon the state ("1" for 4 bits per memory chip and "0" for 8 bits per memory chip) of the mode bit 108 (M), via the following equations:

$C0=P0$ $C1=P1$ $C2=P2+(M)P3$ $C3=(/M)P3$

Wherein /M=the logical complement of the value of M.

From the foregoing it can be seen that check bits 0–3 (vector C0) and 4–7 (vector C1) are identical to the parity vectors P0 and P1 respectively. If the mode bit 108 is set to 0 as in the case of the 8 bit per chip memory arrangement, then check bits 8–11 (vector C2) are equal to the parity vector P2 and check bits 12–15 (vector C3) are equal to the parity vector P3. Alternatively, if the mode bit 108 is set to 1 as in the case of the 4 bit per chip memory arrangement, then check bits 8–11 (vector C2) are equal to the XOR of parity vectors P2 and P3 and check bits 12–15 (vector C3) would be set to 0. As we have previously noted, for the 4 bit per DRAM configuration, the vector C3 (check bits 12–15) are "don't care" bits.

Figure 2:
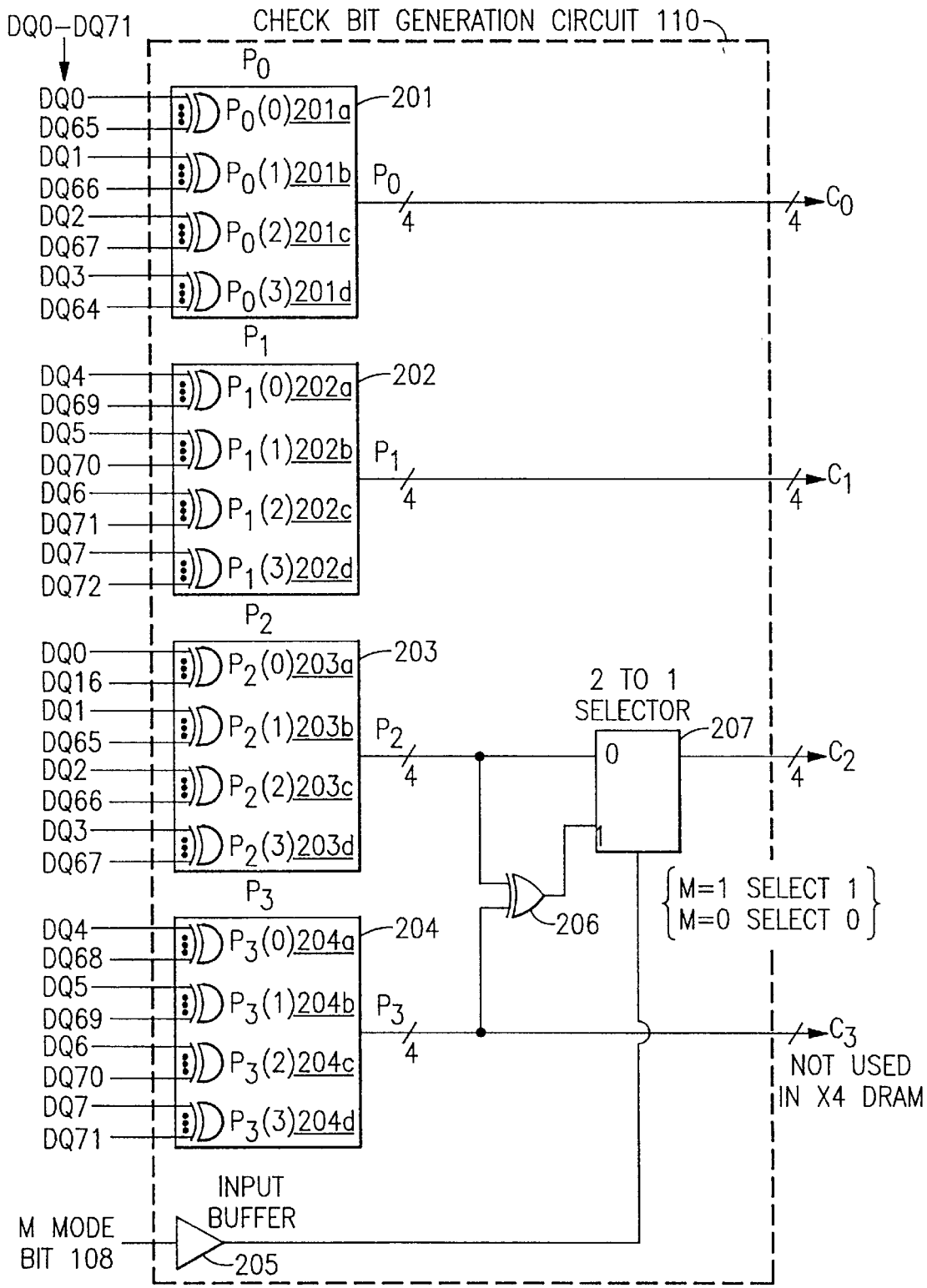
FIG. 2 depicts a detailed functional view of the check bit generation circuit.

In view of the foregoing we may now turn to FIG. 2, wherein a more detailed representation of the check bit generation circuit 110 is illustrated. The check bit generation circuit receives the 72 bit word DQ0–DQ71 which in the preferred embodiment includes data bits 106 and check bits 107 from the system I/O staging buffer 105 and the mode bit M 108 from the ASIC receiver 109. Within the check bit generation circuit 110, the 72 bits DQ0–DQ71 are received and input into a series of parity vector generation logic blocks 201–204 which respectively generate parity vectors P0–P3. Within each parity vector generation logic unit, four multiple input XOR gates (for example gates 201*a*–201*d* for parity vector generation logic 201) receive the appropriate bits from the 72 bit word, required to generate each bit of the 4-bit nibbles for P0–P3 (i.e. P0(0), P0(1), P0(2) and P0(3) for P0). Thus, as described above the XOR gate for P0(0) (XOR 201*a*) would receive bits DQ10, DQ11, DQ18, DQ25, DQ32, DQ35, DQ42, DQ43, DQ49, DQ50, DQ56, DQ57, DQ58, DQ64, and DQ65 from the 72 bit word (illustrated as inputs DQ0 * * * DQ65). For ease of illustration only a few illustrative input DQ lines are shown in FIG. 2, however it is to be understood that each of the XOR gates receives as input the DQ bits required to generate its particular parity bit within the parity vector. Upon receiving the appropriate data 106 bits and check bits 107 from the 72 bit word, the XOR gates generate each bit of the 4-bit nibbles comprising the parity vectors P0–P3, which are output from the parity vector generation logic blocks 201–204.

As previously noted, irrespective of the DIMM memory configuration (for example, either 4 or 8 bits per chip), parity vectors P0 and P1 are equal to check bit vectors C0 and C1 respectively, which in turn comprise check bits 0–3 and 4–7 respectively. Accordingly, the output of the parity vector generation logic blocks 201 and 202 are output from the check bit generation circuit 110 as C0 and C1 respectively.

The value of check bit vectors C2 and C3 differ depending upon the memory configuration on the DIMM as represented by the state of the mode bit M 108. Referring to FIG. 2 we see that the mode bit M 108 from the ASIC receiver 109 is received at the input buffer 205 of the check bit generation circuit 110. The output (P3) of parity vector generation logic unit 204 is input to XOR gate 206 along with the output (P2) of parity vector generation logic unit 203. The output of the XOR gate 206 is in turn input into a 2 to 1 multiplexer 207 together with the output (P2) of parity vector generation logic unit 203. The multiplexer 207 selects either of these two inputs to be output based upon the state of the mode bit m 108, which is received at the multiplexer 207 from the input buffer 205. If the mode bit is equal to 0 as would be the case in an eight bit per chip memory configuration, the P2 input is selected by the multiplexer 207 to be output for the check bit vector C2 and the parity vector P3 is output as the check bit vector C3. Alternatively, if the mode bit M 108 is equal to 1 as would be the case in a four bit per chip memory configuration, the output selected by the multiplexer 207 is P2+P3 (from XOR gate 206) for the check bit vector C2 and the check bit vector is not used, so the values are "don't care" values.

The 12 to 16 check bits 111 generated by the check bit generation circuit 110 are passed along to the memory I/O staging buffer 112 wherein they are buffered along with and appended to the 72 bit word for storage in the memory chips 102 thereby completing a data store operation such as a write operation.

SYNDROME BIT GENERATION:

Once a data storage operation has been completed and the 72 bit word DQ0–DQ71 along with the appended check bits 111 (vectors C0–C2 or vectors C0–C3) has been stored in the memory chips 102, the first stage of the inventive ECC is accomplished. The second stage of the ECC technique involves verifying, upon the execution of a data fetch operation (such as the execution of a read command) wherein the stored word is to be read from the memory chips 102, that the word read out of the memory is identical to the word that had previously been written into memory. As previously noted, the present invention provides a robust multiple bit error control capability that includes, without limitation, the ability to detect and correct errors resulting from the failure of an entire DRAM chip. The detection and location of these and other errors is carried out by the error detection unit 113, and therein, the syndrome bit generation unit 114 is responsible for detecting whether any errors have occurred within the fetched 72 bit word DQ0–DQ71.

The syndrome bits 115 generated by the syndrome bit generation unit 114 are the product of a comparison between the check bits 111 that were originally stored with the 72 bit word in the memory chips 102 during a data store operation such as the execution of a write command, and a new set of check bits 111 generated based upon the 72 bit word that has been fetched from the memory chips such as would occur in the execution of a read command in the computer system. If the retrieved check bits and the newly generated check bits are not identical, an error has occurred within the stored word within the 72 data bits or in the 12 to 16 check bits. Accordingly, to accomplish this comparison, it is necessary for the syndrome bit generation unit 114 to receive the 72 bit word from the memory chips 102 and to perform a check bit generation operation which is identical to the operation previously described for the check bit generation circuit 110.

Figure 3:
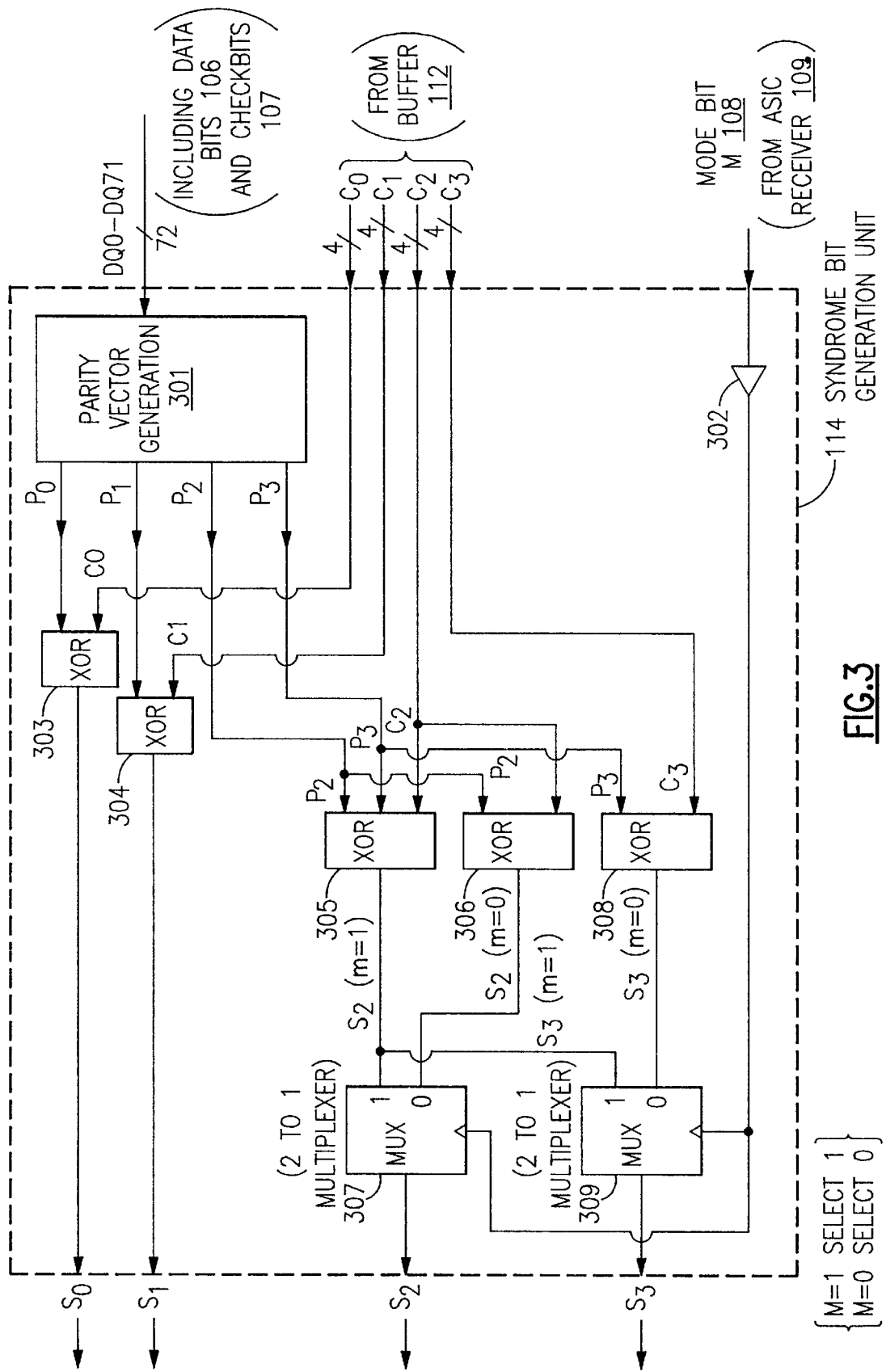
FIG. 3 depicts a detailed functional view of the syndrome bit generation unit.

With the foregoing as background we now may examine the function of the syndrome bit generation unit 114 in greater detail. FIG. 3 provides a block-level illustration of the functional components of the syndrome bit generation unit 114. The 72 bit word DQ0–DQ71 including data bits 106 and check bits 107 is retrieved from the memory chips 102 upon the execution of a data fetch operation such as a read command and passed through the memory I/O staging buffer 112 to be input into the syndrome bit generation unit 114. Within the syndrome bit generation unit 114, the 72 bits are received by the parity vector generation block 301, which functions identically to the parity vector generation logic blocks 201–204 described in reference to the check bit generation circuit 110 illustrated in FIG. 2. The parity vector generation block 301 outputs parity vectors P0, P1, P2 and P3 based upon the retrieved values of the 72 bits DQ0–DQ71.

Since the syndrome bit generation unit 114 must use the newly generated parity vectors in a manner similar to the check bit generation circuit 110, the mode bit 108 M is likewise received by input buffer 302 at the syndrome bit generation unit's check bit generation logic, from the ASIC receiver 109. Finally, the stored values of the check bit vectors 111 (C0–C3) are fetched from the memory chips 102 through the memory I/O staging buffer 112 and received by the syndrome bit generation unit 114 for detecting the presence of errors in the retrieved word.

Generation of the syndrome bits 115 within the syndrome bit generation unit 114 is accomplished by combining the retrieved check bit vectors 111 with a corresponding set of newly generated check bit vectors. The generated syndrome bits 115 have a length of 16 bits irrespective of the memory arrangement on the DIMM. Syndrome vectors 115 S0, S1, S2, and S3, each being a 4-bit nibble, correspond to each of the check bit vectors C0, C1, C2 and C3 respectively. If the combination of the retrieved and regenerated check bit vectors create any non-zero syndrome bits, an error within the retrieved word has been detected. Specifically, the following equations are used to generate the syndrome vectors 115:

$$S0 = C0 + (P0)$$

$$S1 = C1 + (P1)$$

$S2=C2+P2+(M)P3$ $S3=(/M)C3+(/M)P3+(M)S2$ (wherein M=1 for 4 bit per chip DRAMs and M=0 for 8 bit per chip DRAMs)

Inspection of the foregoing equations reveal that syndrome vectors 115 S0, S1 and S2 are simply the XOR of the corresponding received check bit vector with the newly generated check bit vector (in the case of the 8 bit per chip memory configuration where M=1; S2=C2+P2+P3). The S3 syndrome vector is equal to the retrieved C3 XORed with the regenerated P3 for the eight bit per chip memory arrangement (where M=0) but S3 is equal to S2 for the 4 bit per chip memory arrangement (where M=1). This doubling of the S2 vector where M=1 is used to assist in locating an error in the error location unit 116.

Referring again to FIG. 3 we see that the parity vectors P0–P3 generated by the parity vector generation unit 301 are logically combined with the check bit vectors 111 C0–C2 (or C0–C3 as the case may be) received from the memory I/O staging buffer 112, to produce the syndrome vectors 115 in accordance with the foregoing equations. Specifically, S0 is generated by combining C0 and P0 in XOR gate 303, and S1 is generated by combining C1 and P1 in XOR gate 304. S2 is generated by combining P2, P3 and C2 in XOR gate 305 and combining C2 and P2 in XOR gate 306 and combining their respective outputs in the 2 to 1 multiplexer 307. Multiplexer 307 receives the mode bit M 108 from input buffer 302 and selects the output of XOR 305 (i.e. C2+P2+P3) as S2 if M=1, or alternatively selects the output of XOR 306 (C2+P2) as S2 if M=0. Likewise, S3 is generated by combining P3 and C3 in XOR gate 308 and combining the outputs of XOR gate 305 (i.e. C2+P2+P3) and XOR gate 308 (C3+P3) in a 2 to 1 multiplexer 309. Multiplexer 309 receives the mode bit M 108 from input buffer 302 and selects the output of XOR 305 (i.e. C2+P2+P3) as S3 if M=1, or alternatively selects the output of XOR 308 (C3+P3) as S3 if M=0.

As previously noted, the syndrome vectors 115 merely detect the presence of errors within the 72 bit word. If any of the syndrome bits are non-zero, the syndrome bit generation unit 114 has detected the presence of erroneous bit(s) within the retrieved word. Once such an error has been detected, the location of the detected error is determined in the error location unit 116.

ERROR LOCATION OPERATION

Upon generation of the syndrome vectors 115 (comprising the syndrome bits) by the syndrome bit generation unit 114, the vectors S0–S3 are passed to the error location unit 116. The error location unit performs logic operations on the received syndrome vectors 115 to determine the precise location of the erroneous bit(s) within the word including the 72 bits DQ0–DQ71 and the check bits represented by check bit vectors C0–C2 or C0–C3. The result of the logic operations performed within the error location unit 116 for a 72 bit word containing bit error(s) is a so-called nibble error indicator 118 (NEI) which is a single bit, which may be set to a value of "1" to indicate which of the 18 nibbles of data (D0–D17) within the 72 bit word includes the error(s). By assigning an NEI 118 in the range of NEI 0–NEI 17 to correspond to the eighteen 4-bit data nibbles within the 72 bit data word, further operations may be performed by the error correction unit 119 to restore the identified 4-bit data nibble(s) within the 72 bit word to their original value.

In the 72 bit embodiment of the invention the logic operations performed by the error location unit 116 are as follows:

NEI 0=1 if S0=S2 and S2/=0
NEI 1=1 if S1=S3 and S3/=0
NEI 2=1 if S0=(T1)S2 and S2/=0
NEI 3=1 if S1=(T1)S3 and S3/=0
NEI 4=1 if S0=T2(S2) and S2/=0
NEI 5=1 if S1=(T2)S3 and S3/=0
NEI 6=1 if S0=(T3)S2 and S2/=0
NEI 7=1 if S1=(T3)S3 and S3/=0
NEI 9=1 if S1=(T4)S3 and S3/=0
NEI 10=1 if S0=(T5)S2 and S2/=0
NEI 11=1 if S1=(T5)S3 and S3/=0
NEI 12=1 if S0=(T6)S2 and S2/=0
NEI 13=1 if S1=(T6)S3 and S3/=0
NEI 14=1 if S0=(T7)S2 and S2/=0
NEI 15=1 if S1=(T7)S3 and S3/=0
NEI 16=1 if S0=(T8)S2 and S2/=0
NEI 17=1 if S1=(T8)S3 and S3/=0
NEI 18=1 if S2=S3=0 and S0/=0
NEI 19=1 if S2=S3=0 and S1/=0
NEI 20=1 if S0=S1=0 and S2/=0
NEI 21=1 if S0=S2=0 and S3/=0

From the foregoing it can be seen that upon the generation of a non-zero syndrome bit, the error location unit 116 performs a comparison between the syndrome vectors 115 (S0–S3) to narrow the location of the erroneous bit(s) to a single data nibble D0–D17 within the 72 bit word. NEI 18–NEI 21 correspond to errors within the check bits and do not require further correction prior to passing the 72 bit word back to the computer system, however they are useful for the detection of uncorrectable errors as will be subsequently described.

Upon examination of the foregoing logical statements used in localizing an erroneous data nibble within the 72 bit word, it is readily apparent that the determination of the erroneous nibble(s) is performed via a two step process. First, we determine whether S2 or S3 are non-zero. This determination localizes the erroneous nibble to either D0, D2, . . . D16 for S2/=0 or D1, D3, . . . D17 for S3/=0. Next we attempt to equate the determined syndrome vector containing the non-zero value with the previously generated syndrome vector having the same data nibbles. For example, if S3 is a non-zero vector, we attempt to determine which data nibble therein is non-zero by comparing it with S1. If S3=S1 then we know that the data nibble D1 must contain the error since each of the other data nibbles in S1 is multiplied by one of the CBGs (T1–T8). Likewise, if S1=(T1)S3 we know that D3 must be the erroneous data nibble since D3 is multiplied by T1 in syndrome vector S1.

Inspection of the foregoing logical expressions additionally reveals the manner in which errors precipitated by entire DRAM failures in a 4 bit per chip or 8 bit per chip memory system may be detected and corrected in the present invention. Since the NEI's localize a 4-bit data nibble containing erroneous bit(s), the failure of a 4 bit per chip DRAM would toggle a single NEI. In an 8 bit per chip memory system each pair of adjacent data nibbles would represent a single DRAM. For example, D0 and D1 would be provided by a first DRAM chip whereas D2 and D3 would be provided by a second 8 bit per chip DRAM and so on. Since each successive NEI corresponds to alternating non-zero values in S2 (comprising the even data nibbles) and S3 (comprising the odd data nibbles), the toggling of adjacent NEIs (such as NEI 0 and NEI 1 or NEI 2 and NEI 3) would signal a chip failure for an eight bit per chip DRAM.

Figure 4:
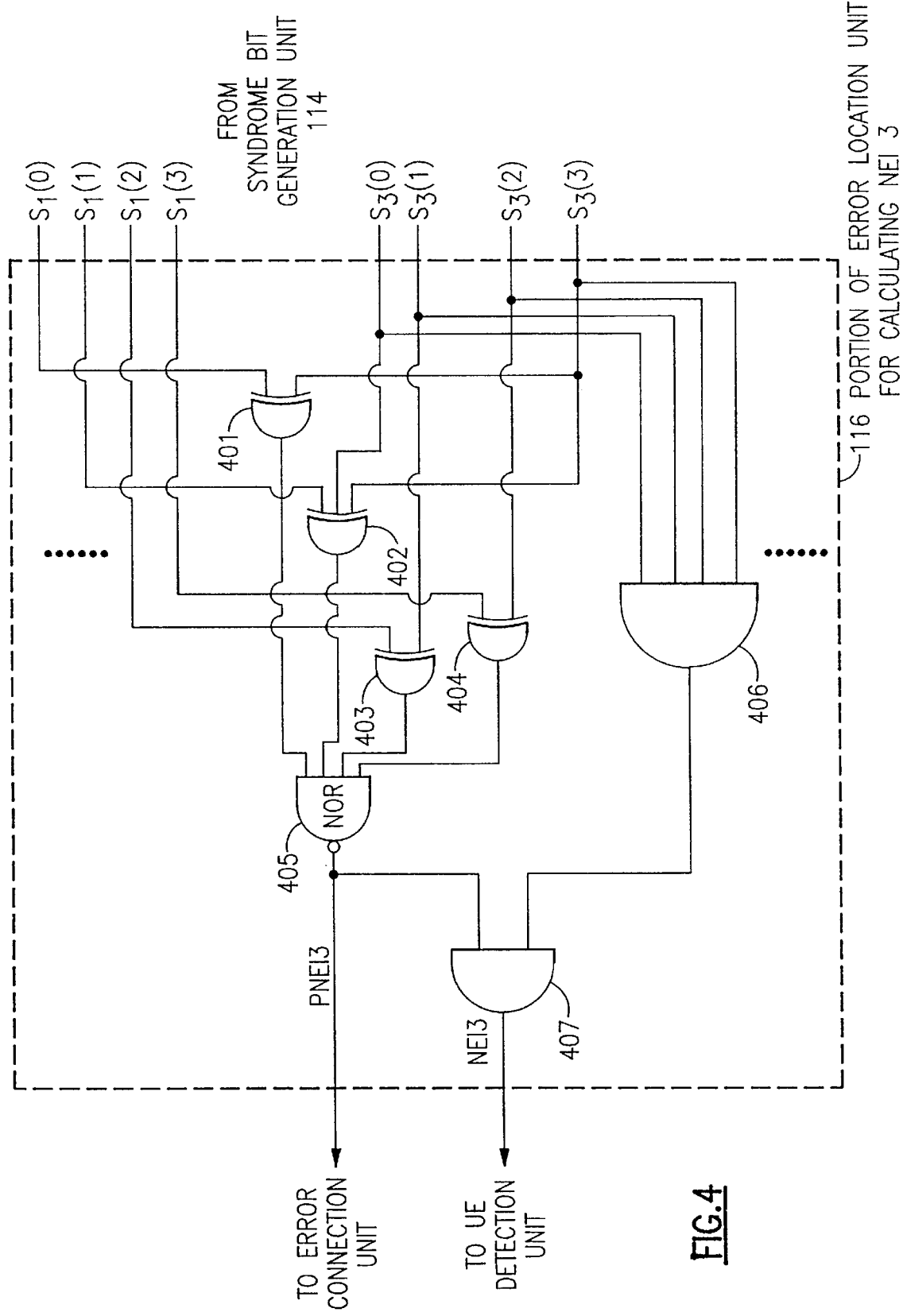
FIG. 4 illustrates a detailed functional view of the portion of the error location unit for nibble error indicator 3.

To better understand the logical function of the error location unit 116, reference may be had to FIG. 4 wherein an exemplary illustration of the operation of the error location unit for NEI 3 is presented. Since we have already noted that NEI 3=1 if S1=(T1)S3 and if S3/=0, we can readily provide the requisite logic to ascertain whether NEI 3 should be set to 1. The first step in ascertaining the state of NEI 3 involves determining if S1=(T1)S3. Since we have previously provided the T1 matrix and since we know that S3 comprises S3(0), S3(1), S3(2) and S3(3) we can see that the combination (T1)S3 yields:

$$\begin{vmatrix} 0 & 0 & 0 & 1 \\ 1 & 0 & 0 & 1 \\ 0 & 1 & 0 & 0 \\ 0 & 0 & 1 & 0 \end{vmatrix} * \begin{vmatrix} S3(0) \\ S3(1) \\ S3(2) \\ S3(3) \end{vmatrix} = \begin{vmatrix} S3(3) \\ S3(0) + S3(3) \\ S3(1) \\ S3(2) \end{vmatrix}$$

Additionally, since we know that if S1=(T1)S3, then S1+(T1)S3=0, we also know that if:

$$\begin{vmatrix} S1(0) \\ S1(1) \\ S1(2) \\ S1(3) \end{vmatrix} + \begin{vmatrix} S3(3) \\ S3(0) + S3(3) \\ S3(1) \\ S3(2) \end{vmatrix} = \begin{vmatrix} 0 \\ 0 \\ 0 \\ 0 \end{vmatrix}$$

then NEI 3=1. Thus, we may view in FIG. 4 the portion of the error location unit 116 which performs the logical function for NEI 3. Although the remaining logic for the entire error location unit is not illustrated for purposes of clarity, it will be readily apparent that the same types of logic operations are performed for each of the foregoing logical expressions to determine the state of each of the NEIs.

In FIG. 4, the syndrome bits corresponding to syndrome vectors S0 and S3 115 are received at the error location unit 116. The syndrome bits S1(0) and S3(3) are combined in XOR gate 401, the syndrome bits S1(1) and S3(0) and S3(3) are combined in XOR gate 402, the syndrome bits S1(2) and S3(1) are combined in XOR gate 403 and syndrome bits S1(3) and S3(2) are combined in XOR gate 404. To ensure that each of these XOR operations yields logical 0, the outputs of these XOR gates are input to NOR gate 405 which has an output which we shall designate as PNEI 3. The output of NOR gate 405 PNEI 3 should be equal to 1 if S1=(T1)S3 (i.e. if all of the inputs thereto are equal to 0). The PNEI 3 signal is output from the error location unit 116 for use by the error correction unit 119.

In the next operation it is determined that S3/=0. Each of the syndrome bits comprising vector S3 (i.e. S3(0), S3(1), S3(2) and S3(3)) are combined in OR gate 406. The output of this OR gate will be a "1" if any of the syndrome bits S3(0)–S3(3) are equal to 1.

Finally, the output of NOR gate 405 PNEI 3 and OR gate 406 are combined in AND gate 407. As we have noted, both of these outputs should be equal to "1" if the conditions S1=(T1)S3 and S3/=0 are true, accordingly, NEI 3 is the output of the AND gate 407, which, if equal to 1, represents a single or multiple bit error in the 3rd data nibble D3 of the 72 bit word (i.e. DQ12–DQ15). This NEI 3 signal is passed along to the uncorrectable error (UE) detection unit 117 for ascertaining whether the error detected by the syndrome bit generation unit 114 is uncorrectable. As noted earlier, the PNEI 3 signal is provided to the error correction unit 119 which will begin correction operations on the corresponding data nibble (D3) if PNEI 3=1, however, if S3=0 NEI 3 will equal 0 corresponding to an uncorrectable error which will be detected by the UE detection unit 117. The operation of the UE detection unit 117 and the error correction unit 119 will be subsequently discussed in detail.

Error Correction Operation:

The PNEI signals generated at the error location unit 116 are passed to the error correction unit 119. The PNEIs identify to the error correction unit 119, which of the eighteen 4-bit data nibbles D0–D17 may include the erroneous bit(s). The error correction unit, upon receiving the PNEIs performs logic operations upon the identified data nibbles to restore the original bit values thereto.

For illustrative purposes we will continue to consider the foregoing example wherein PNEI 3=1 was generated by the error location unit 116. In accordance with the foregoing example we know that when PNEI 3=1 an error with respect to data nibble 3 (i.e. D3) comprising data bits 8–12 has been located. Further examination of the operation of the error location unit 116 reveals that the generation of the "1" value for PNEI 3 required that the syndrome vector S1 was equal to the product of check bit generation matrix T1 combined (in an AND operation) with syndrome vector S3. As previously noted, this condition specifically localizes the erroneous bit(s) within the fourth data nibble (D3), which would appear as non-zero values within the S3 syndrome vector 115. The location(s) of these non-zero value(s) represent the bit location(s) that have changed between the 72 bit word that was originally stored in the memory chips 102 and those that were subsequently retrieved therefrom. Thus, for example if D3 in the original 72 bit word was equal to (1011) and when retrieved was equal to (1001), the resultant S3 vector (assuming no other errors) would be:

$$S3 = 0000 + 0010 + 0000 + 0000 + 0000 + 0000 + 0000 + 0000 + 0000$$
$$= 0010$$

Accordingly, since the S3 vector identifies the position wherein the stored and retrieved data nibbles differ it follows that by performing an exclusive OR operation between the retrieved data nibble and S3 we will regenerate the original value of the stored data nibbles, for example:

$$S3 + D3 \text{ (retrieved)} = D3 \text{ (stored)}$$

$$(0010) + (1001) = (1011)$$

Applying the same analysis to the foregoing set of logical expression for generating the PNEIs we may generate nibble error patterns (NEPs) which may be XORed with the retrieved erroneous data nibble to restore the originally stored value of the nibble. The list of NEPs corresponding to the foregoing PNEIs is as follows:

If PNEI 0=1 then NEP 0=S2
If PNEI 1=1 then NEP 1=S3
If PNEI 2=1 then NEP 2=S2
If PNEI 3=1 then NEP 3=S3
If PNEI 4=1 then NEP 4=S2
If PNEI 5=1 then NEP 5=S3
If PNEI 6=1 then NEP 6=S2
If PNEI 7=1 then NEP 7=S3
If PNEI 8=1 then NEP 8=S2
If PNEI 9=1 then NEP 9=S3
If PNEI 10=1 then NEP 10=S2
If PNEI 11=1 then NEP 11=S3

If PNEI 12=1 then NEP 12=S2
If PNEI 13=1 then NEP 13=S3
If PNEI 14=1 then NEP 14=S2
If PNEI 15=1 then NEP 15=S3
If PNEI 16=1 then NEP 16=S2
If PNEI 17=1 then NEP 17=S3

Figure 5:
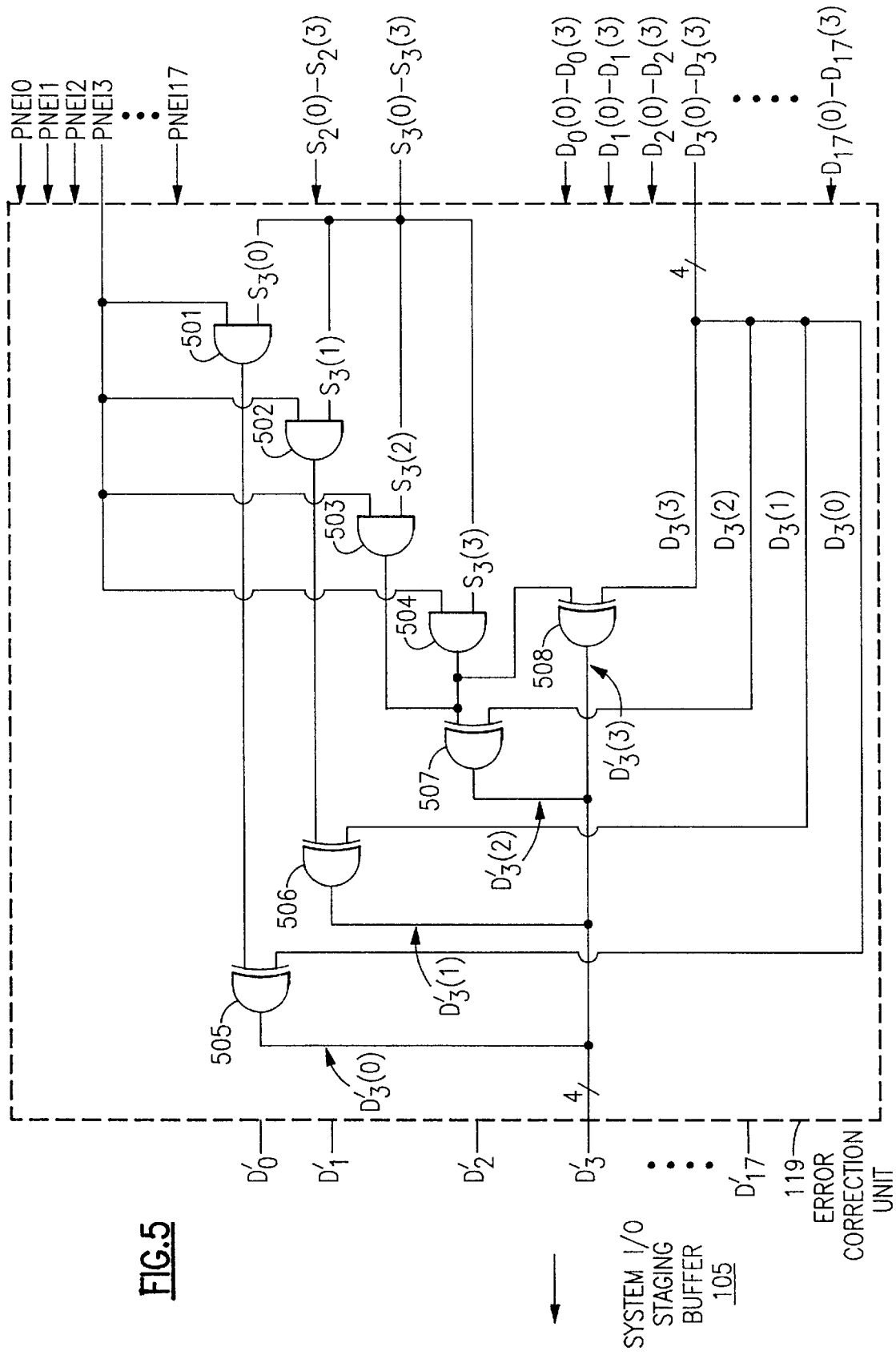
FIG. 5 illustrates a detailed functional view of the error correction unit.

The foregoing logical expressions are implemented within the error correction unit 119. The operation of the error correction unit is detailed in FIG. 5, which for purposes of clarity only shows the logical operation of error correction for data nibble D3. It will be understood that the same type of logic is applied to each data nibble in accordance with the foregoing expressions to accomplish data correction for each of the eighteen data nibbles. The error correction unit 119 receives the PNEIs from the error location unit 116, it receives the syndrome vectors S2 and S3 from the syndrome bit generation unit 114 and the 72 bit word (comprising 4-bit data nibbles D0–D17) from the memory I/O staging buffer 112.

In the illustrated example we follow the logic for performing data correction to data nibble D3. Each of the bits comprising the syndrome vector S3 (i.e. S3(0), S3(1), S3(2) and S3(3)) are combined in separate AND gates (AND gates 501–504) with the PNEI 3 bit from the error location unit 116. Assuming that the PNEI 3 bit has been set to "1" by the previously described operations within the error location unit 116, the original values of the syndrome bits (S3(0)–S3(3)) are output from AND gates 501–504. These outputs are in turn combined in XOR gates 505–508 with the corresponding bits comprising the data nibble D3, such that S3(0) and D3(0) are combined in XOR gate 505, S3(1) and D3(1) are combined in XOR gate 506, S3(2) and D3(2) are combined in XOR gate 507 and S3(3) and D3(3) are combined in XOR gate 508. The corrected 4-bit data nibble output D'(3) includes corrected bits D'3(0), D'3(1), D'3(2) and D'3(3). It may be observed in FIG. 5 that when PNEI 3=0 corresponding to the determination that D3 includes no errors, the output of the AND gates 501–504 is a set of "0"'s. When this output is combined in XOR gates 505–508 with D3(0)–D3(3) respectively, the value of the resultant bits D'3(0)–D'3(3) are equal to the value of the original data nibble D3 (i.e D3(0)–D3(3)). Thus, error correction is limited to those data nibbles identified as containing errors by the PNEIs.

After the error correction unit 119 has performed the requisite operations, the corrected 72 bit word comprising 4-bit data nibbles D'0–D'17 is passed along to the system I/O staging buffer 105 which in turn passes the corrected word onto the system data bus 104 for use by the computer system.

UE Detection Operation:

As previously noted, certain type of errors are not capable of correction within the scope of the described embodiment. In particular, the present invention is directed toward providing error detection and correction for single and multiple bit errors up to entire DRAM chip failures for systems having either 4 bit per chip DRAMs or 8 bit per chip DRAMs. Accordingly, errors occurring to a single bit or to multiple bits within a single memory chip may be detected and corrected via the foregoing ECC system. In a four bit per chip DRAM, the 1–4 data bits which may be in error therein may be highlighted by toggling a single NEI. In keeping with our foregoing example, if NEI 3=1 this indicates that 1–4 bits within the 4-bit nibble D3 may be in error. In a four bit per chip system NEI 3=1 may therefore cover the case in which the entire DRAM chip storing the D3 nibble has failed.

Likewise, in an 8 bit per chip memory system, a single bit error or multiple bit error(s) including the case in which all eight bits in a DRAM are in error may be detected and corrected. Thus, for example, if both NEI 2=1 and NEI 3=1 this indicates that there are erroneous bits within the first and second 4 bit nibbles within an 8 bit per chip DRAM. It can therefore ben seen that the present inventive ECC system may provide error detection and correction for multiple bit errors including entire DRAM chip failures in a 4 bit per chip or 8 bit per chip memory system.

If errors occur within multiple memory chips which include more than one data nibble from the set D0, D2, D4 . . . D16 or the set D1, D3, D5 . . . D17, the errors may be uncorrectable within the scope of the present inventive ECC system, however, the system includes a mechanism for alerting the computer system of the error condition, and as such is capable of providing error detection for such situations. Moreover, as previously noted, broader error correction may be provided within the scope of the present invention via the use of additional check bits, however the storage of such longer check bits along with the 72 bit word may well prove cost prohibitive.

In order to better understand the operation of the UE detection unit 117, it will be instructive to first consider the types of errors that may be considered uncorrectable. The primary condition that triggers UE detection is the generation of non-zero syndrome bits, corresponding to the determination of an error condition in the retrieved word. As a preliminary matter it is necessary to define certain logic expressions which will serve to simplify our analysis of the UE detection operation. First, UE 1 will be set equal to the XOR of each adjacent pair of NEIs combined in an OR operation as:

UE 1=(NEI 0+NEI 1) OR (NEI 2+NEI 3) OR (NEI 4+NEI 5) OR . . . OR (NEI 20+NEI 21).

This expression presents a comparison between the error states of adjacent data nibbles (i.e. D0 and D1 etc..). Next UE 2 will be set to the combination of each of the even numbered NEIs in an OR operation as:

UE 2=NEI 0 OR NEI 2 OR NEI 4 OR NEI 6 OR . . . OR NEI 20.

This expression corresponds to the error states of the even numbered data nibbles. Finally, UE 3 will be set to the combination of each of the odd numbered NEIs in an OR operation as:

UE 3=NEI 1 OR NEI 3 OR NEI 5 OR NEI 7 OR . . . OR NEI 21.

This expression corresponds to the error states of the odd numbered data nibbles.

The simplest case of an uncorrectable error occurs when one or more of the syndrome vectors 115 (S0–S3) includes at least one non-zero bit, however none of the NEIs has toggled to zero. As such, where S0–S3/=0, the expression:

(NEI 0=NEI 1=NEI 2= . . . =NEI 21=0)

if true, corresponds to an error detected within one of the data nibbles (D0–D17) or within the check bit nibbles (C0–C2 or C0–C3) by the syndrome bit generation unit 114, which could not be localized by the error location unit 116. Since the error cannot be localized it follows that it cannot be corrected by the error correction unit 119, and as such an uncorrectable error has been detected.

As previously noted, multiple data nibble errors among the even numbered data nibbles (D0, D2 . . . D16) or among the odd data nibbles (D1, D3 . . . D17) in an 8 bit per chip DRAM corresponds to errors in more than a single DRAM which are not correctable. Thus, the expression:

(/M)(UE 1)(UE 2)(UE 3)

if equal to "1" corresponds to an error occurring in non-consecutive even and odd data nibbles in an 8 bit per chip memory system (i.e. an error in more than one DRAM chip) which is uncorrectable in the present invention.

In systems having 8 bit per chip DRAMs an error which is represented by a "1" value for one of the even numbered NEIs corresponds to an error in one of the even numbered data nibbles (i.e. D0, D2, . . . , D16), thus if NEI 0, NEI 2, . . . , NEI 20=0 and S0 or S2 do not equal zero an uncorrectable error has occurred, which is covered by the logical expression:

(/M)(/(UE 2)((S0/=0) OR (S2/=0))

If the foregoing expression equals "1", then although either the S0 or S2 syndrome vectors or both include at least one "1" bit (as generated by the syndrome bit generation unit 114) denoting the presence of an error in one of the even numbered data nibbles (i.e. D0, D2, . . . D16), the even numbered NEIs (i.e. NEI 0, NEI 2, . . . , NEI 20) are all equal to "0" indicating that no such error has been located for correction by the error location unit 116. Accordingly, the unlocated error is uncorrectable. Likewise, in systems having 8 bit per chip DRAMs an error which is represented by a "1" value for one of the odd numbered NEIs corresponds to an error in one of the odd numbered data nibbles (i.e. D1, D3, . . . , D17), thus if NEI 1, NEI 3, . . . , NEI 21=0 and S1 or S3 do not equal zero an uncorrectable error has occurred, which is covered by the logical expression:

(/M)(/(UE 3)((S1/=0) OR (S3/=0))

If the foregoing expression equals "1", then although either the S1 or S3 syndrome vectors or both include at least one "1" bit (as generated by the syndrome bit generation unit 114) denoting the presence of an error in one of the odd numbered data nibbles (i.e. D1, D3, . . . D17), the odd numbered NEIs (i.e. NEI 1, NEI 3, . . . , NEI 21) are all equal to "0" indicating that no such error has been located for correction by the error location unit 116. Since the error cannot be localized it follows that it cannot be corrected.

Finally, in a system having 4 bit per chip DRAMs, for an error to be correctable, it must be detected in either syndrome bits included in syndrome vectors S0 or S1. In a 4 bit per chip system, an error detected via syndrome bits within both the S0 and S1 vector corresponds to a multiple DRAM failure which is considered uncorrectable within the foregoing description of the preferred embodiment of the invention. Accordingly, if the syndrome vectors S0 and S1 both include non-zero syndrome bits in a 4 bit per chip system, the expression:

(M)(S0 not zero)(S1 not zero)

will be equal to a logical value of "1" corresponding to an uncorrectable error.

Combining each of the foregoing logical expressions for detection of uncorrectable errors in the inventive ECC system yields the expression:

UE=(Syndrome bits not all equal to zero) AND ((/M)(UE 1)(UE 2)(UE 3) OR (NEI 0=NEI 1=NEI 2= . . . =NEI 21=0) OR (/M)(/UE 2)((S0 not zero) OR (S2 not zero) ) OR (/M)(/UE 3)((S1 not zero) OR (S3 not zero) ) OR (M)(S0 not zero)(S1 not zero)

which is carried out within the UE detection unit 117.

Figure 6:
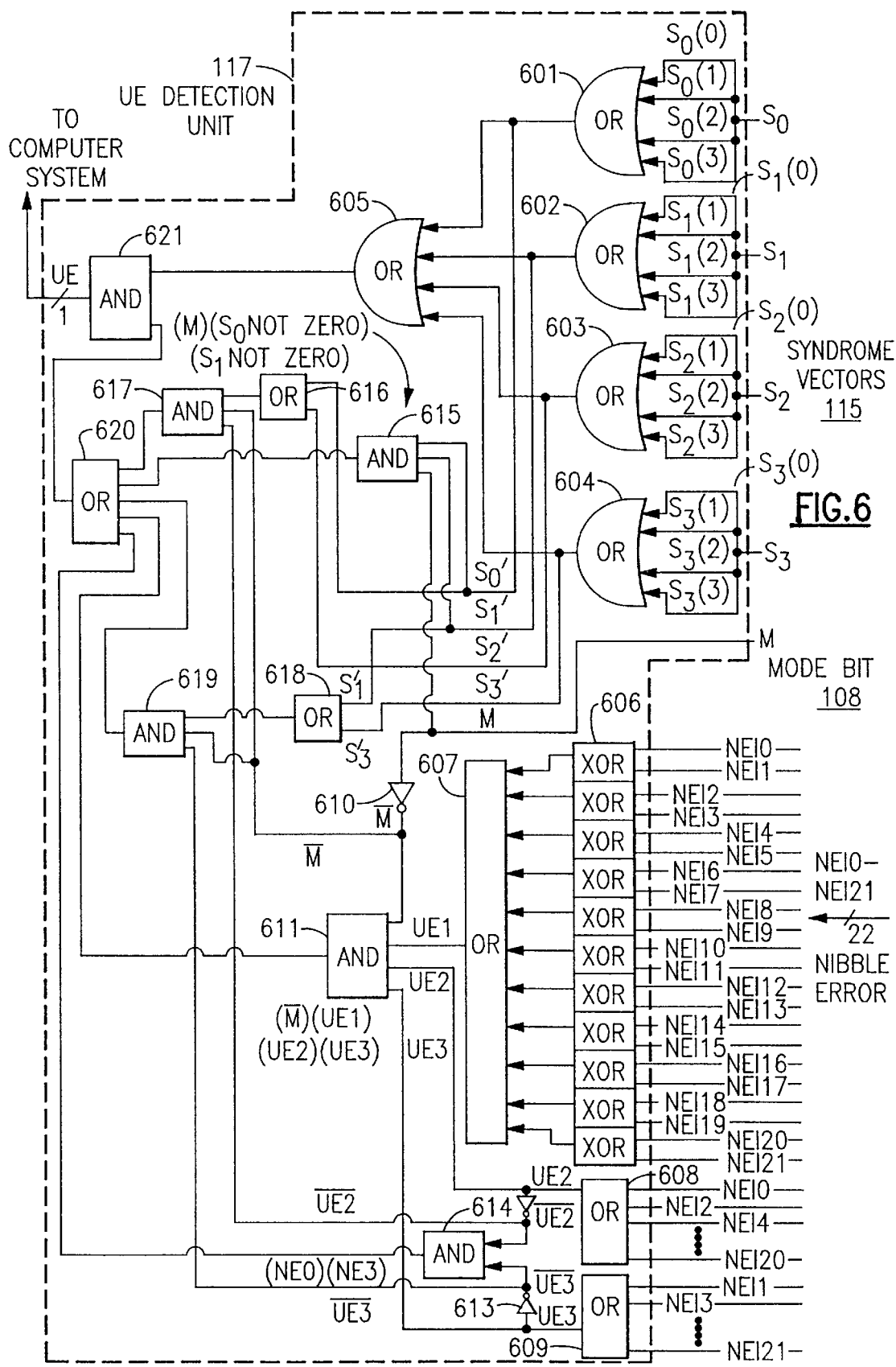
FIG. 6 shows a detailed functional view of the UE detection unit.

Referring now to FIG. 6, the foregoing logical expression is depicted as a set of logical operations carried out within the UE detection unit 117. The syndrome vectors S0–S3 are received from the syndrome bit generation unit 114 and the bits comprising each vector are combined in 4 OR gates (601–604), for example, for the S0 syndrome vector S0(0), S0(1), S0(2) and S0(3) are combined in OR gate 601 such that the output from each of these OR gates will be "0" if each syndrome bit equals "0" or "1" if any of the syndrome bits equal "1". The four outputs from OR gates 601–604 are in turn input into OR gate 605 which will output a "0" only if all of the syndrome bits are equal to "0". Alternatively, if any of the 16 syndrome bits are equal to "1" the output from OR gate 605 will be a "1".

The logic operations for generating UE 1 are performed in XOR gates 606 which respectively combine the NEI bits NEI 0 XOR NEI 1, NEI 2 XOR NEI 3, and so forth for all 22 NEI bits which are received at the UE detection unit 117 from the error location unit 116. The outputs from XOR gates 606 are input to OR gate 607 which in turn outputs UE 1.

UE 2 is generated by combining NEI 0, NEI 2, NEI 4, . . . , NEI 20 in OR gate 608 and UE 3 is generated via the combination of NEI 1, NEI 3, NEI 5, . . . , NEI 21 in OR gate 609.

The mode bit M 108 is received at the UE detection unit 117 from the ASIC receiver 109. The mode bit is passed through inverter 610 and input along with UE 1, UE 2 and UE 3 to AND gate 611 to realize the expression: (/M)(UE 1)(UE 2)(UE 3) as an output therefrom.

The expression (NEI 0=NEI 1=NEI 2=NEI 3 . . . =NEI 21=0) requires that a logical "1" be generated if every one of the NEIs equals 0. This expression is realized by first inverting UE 2 through inverter 612 and inverting UE 3 through inverter 613 and then by combining (/UE 2) and (/UE 3) in AND gate 614 to yield: (/UE 2)(/UE 3), which will equal "1" only if all of the NEIs equal "0".

To generate the expression (M)(S0 not zero)(S1 not zero) each bit comprising the syndrome vectors S0 and S1 are combined in two OR operations 601 and 602, such that S0(0), S0(1), S0(2) and S0(3) are combined in a first OR gate to give a 1 bit product of S0 (which will be "1" if S0 is not all zeros) and the same is done for S1. The output of these two OR operations are then passed through AND gate 615 along with the mode bit 108 to realize the foregoing expression.

To generate the expression (/M)(/UE 2)((S0 not zero) or (S2 not zero)), the four syndrome bits comprising S0 and the four syndrome bits comprising S2 are each input into two 4 input OR gates (601 and 603 respectively) so as to output a "1" I if any of the syndrome bits therein are equal to "1". The outputs of 601 and 603 are combined in OR gate 616, which has its output combined in AND gate 617 with /M and /UE 2 to realize the foregoing expression. Likewise, to realize the expression (/M)(/UE 3)((S1 not zero) or (S3 not zero)), the four syndrome bits comprising S1 and the four syndrome bits comprising S3 are each input into two 4 input OR gates (602 and 604 respectively) so as to output a "1" if any of the syndrome bits therein are equal to "1". The outputs of 602 and 604 are combined in OR gate 618, which has its output combined in AND gate 619 with /M and /UE 3.

Finally each of the foregoing expressions is combined in OR gate 620, which in turn has its output combined with the output of OR 605 (which is "1" if any of the syndrome bits are equal to "1") in AND gate 621 which outputs the UE detection bit to the computer system for use by the existing error correction logic therein.

As noted previously, if the UE bit were to be provided to the error correction unit 119 to stop the correction of errors therein, it is possible that the UE bit may be received at the error correction unit 119 after the error correction unit has begun attempting to correct detected errors in the 72 bit word (after receipt of the PNEI bits) and could hold up the passage of the uncorrectable word to the computer system. Such an implementation would, however, require buffering of the 72 bit word at the error correction unit 119 in order to allow the UE detection operation to complete and signal the error correction unit prior to allowing the 72 bit word to pass through the system I/O staging buffer 105 on to the data bus 104 of the computer system. This buffering of every 72 bit word in order to catch the relatively few words including uncorrectable errors would create unnecessary system inefficiencies. Accordingly, in the preferred embodiment of the invention, the UE detection signal is passed directly to the error control logic previously existing on the computer system to signal the presence of a data word including uncorrected bits of data.

Figure 7:
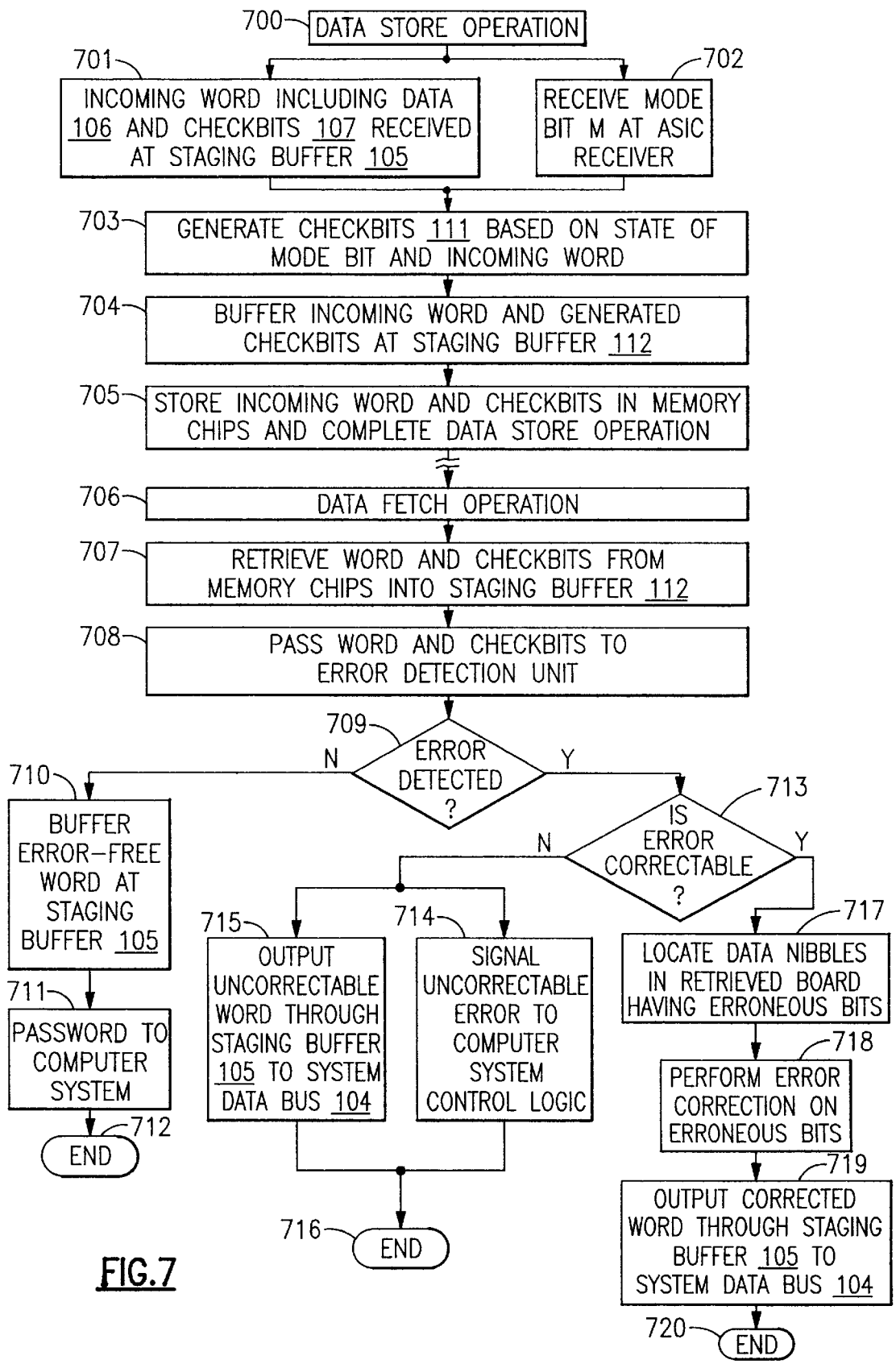
FIG. 7 depicts a flow diagram generally encompassing the steps of the inventive ECC process.

To better understand how each of the previously described functional components interoperate in the present invention reference may be had to FIG. 7 wherein a flow diagram for the inventive ECC process is shown.

Starting with the execution of a data storage operation 700 by the computer system such as the execution of a write operation, the incoming 72 bit word, which includes both data bits 106 and check bits 107 which were generated via the pre-existing error control scheme for the computer system are received in the system I/O staging buffer 105 in step 701. The state of the mode bit M 108 is concurrently read by the ASIC receiver 109 in step 702. The mode bit M and the 72 bit word are both received at the check bit generation circuit 110 which generates check bits 111 as previously described for the received 72 bit word based upon the values of the received bits DQ0–DQ71 (vectors D0–D17) and the mode bit M 108, in step 703. Upon generation of the check bits 111 by the check bit generation circuit, the 72 bit word along with the appended 12 or 16 check bits 111 (depending on the memory chips used on the DIMM as indicated by the state of the mode bit M) are buffered in the memory I/O staging buffer 112 for subsequent storage in the memory chips 102 in step 704. Thereafter the buffered 72 bit word and check bits 111 are stored in the memory chips 102 ending the data store operation at step 705.

When the computer system executes a data fetch operation, such as a memory read operation, which requires the retrieval of the previously stored 72 bit word in step 706, the stored word and check bits 111 are retrieved from the memory chips 102 into the memory I/O staging buffer 112 in step 707. In step 708 the retrieved word and check bits are passed to the error detection unit 113 comprising the syndrome bit generation unit 114, the error location unit 116 and the UE detection unit 117. If the error detection unit 113 detects an error within the retrieved word the "yes" branch of the decision point at step 709 is traversed. Alternatively, if no error is detected by the error detection unit 113, the no branch of decision point 709 is followed.

Assuming that no errors are detected by the error detection unit 113 at decision point 709, the process proceeds to step 710 wherein the correct retrieved word is buffered at the system I/O staging buffer 105. Finally, at step 711 the buffered word is passed onto the computer system data bus 104 completing the data fetch operation 712.

If errors within the retrieved word are detected in the error detection unit 113 at decision point 709, the process continues to decision point 713 wherein the UE detection unit 117 determines whether the errors are correctable. If the errors that have been detected are determined to be uncorrectable for any of the foregoing reasons, the no branch of decision point 713 is traversed. The UE detection unit signals the UE condition at step 714 which is passed to the computer system error control logic and the uncorrected (and uncorrectable) word is concurrently passed to the computer system data bus 104 through the system I/O staging buffer 105 at step 715 thereby ending the data fetch operation 716.

If the error that has been detected at decision point 709 is a correctable error within the context of the present inventive ECC, the yes branch of decision point 713 is traversed to step 717 wherein the data nibble(s) containing the erroneous bits are located by the error location unit 116. Once the erroneous bits are localized to a data nibble (or two nibbles in the case of an 8 bit per chip DRAM) these locations are passed to the error correction unit 119, which corrects the erroneous data nibbles 718 and passes the corrected word through the system I/O staging buffer 105 to the computer system data bus 104 in step 719 thereby completing the data fetch operation 720.

Figure 8:
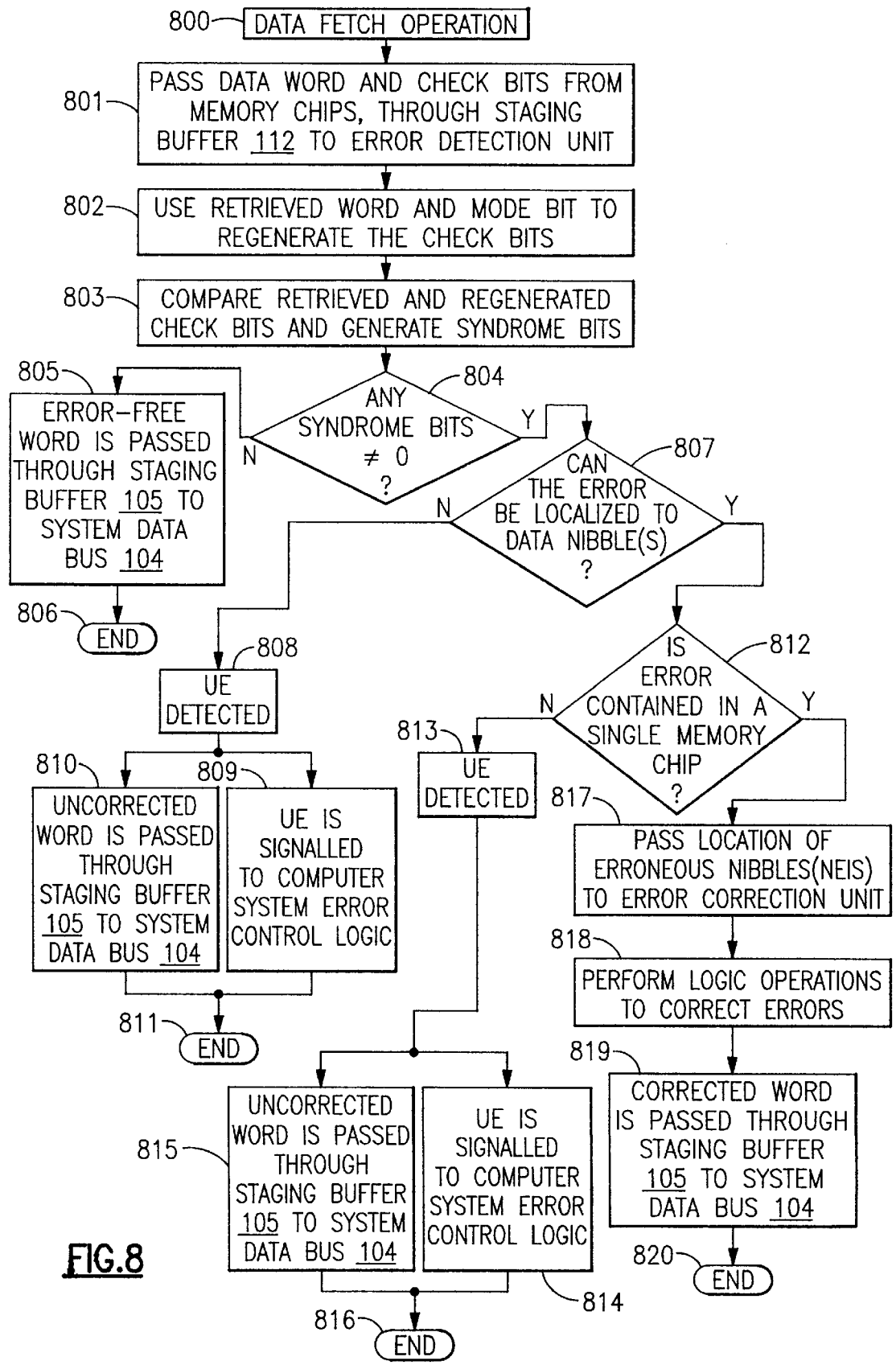
FIG. 8 illustrates a detailed flow diagram for the error detection, correction and the UE detection processes.

To better appreciate the error detection and correction process including the generation of the UE detection signal we now turn to the flow diagram illustrated in FIG. 8 which provides a more detailed view of the logical flow for these operations.

Starting with the initial execution of a data fetch operation in step 800, the computer system causes the memory chips 102 including the 72 bit word (which includes data bits 106 and check bits 107) along with the previously generated and stored check bits 111 to be passed through the memory I/O staging buffer 112 to the error detection unit 801. Within the error detection unit, the syndrome bit generation unit 114 uses the retrieved 72 bit word along with the current state of the mode bit 108 to regenerate check bits in step 802. thereafter, in step 803 the retrieved check bits 111 and regenerated check bits are compared in the syndrome bit generation unit 114 to generate the syndrome bits 115.

At decision point 804 it is determined in the error location unit 116 whether any of the syndrome bits 115 are non-zero. If none of the syndrome bits are non-zero, the retrieved data word is identical to the stored data word, and accordingly it is not in need of correction. Thus, at step 805 the error-free word is passed through the system I/O staging buffer 105 back to the computer system data bus 104 thereby ending the data fetch operation 806.

If the error location unit 116 determines that the syndrome bits are not all non-zero, the process traverses the yes branch of decision point 804 to decision point 807 wherein it is determined whether the erroneous bits within the retrieved word can be localized by the error location unit 116.

If no localizing of the errors can be accomplished (i.e. if none of the NEIs is toggled to "1") the error cannot be corrected, we therefore traverse the no branch of decision point 807 to step 808 wherein a UE is detected at the UE detection unit 117. The UE detection unit sets the UE signal at "1" in accordance with the foregoing and previously illustrated logic operations and the UE signal is passed to the previously existing error control logic for the computer system in step 809. Concurrently, the uncorrected (and uncorrectable) word is passed through the system I/O staging buffer 105 to the computer system data bus 104 in step 810 and the data fetch operation is ended 811.

If the error location unit 116 successfully localizes the erroneous bits to one or more of the data nibbles, the yes branch of decision point 807 is traversed to arrive at decision point 812. At decision point 812 we determine whether the localized erroneous bits reside within a single 4 bit per chip or 8 bit per chip DRAM. As we had previously noted each data nibble represents a different DRAM in a 4 bit per chip system while each successive pair of data nibbles represent a different DRAM in an 8 bit per chip system. Assuming that the error is located in more than one memory chip 102, we traverse the no branch of decision point 812 to step 813. Since the present ECC does not correct errors occurring in more than one memory chip the UE detection unit 117 toggles the UE bit to "1" 813 signalling an uncorrectable error to the computer system 814 error control logic. Concurrently, the uncorrected data word is passed to the computer system 815 and the data fetch operation is ended 816.

If the error can be localized within one DRAM in a 4 bit per chip or 8 bit per chip memory system, we traverse the yes branch of the decision point 812 to step 817. Since the error has been localized at the error location unit 116 we have successfully generated at least one non-zero NEI, the corresponding PNEI is passed in step 817 to the error correction unit 119, which upon receipt of the PNEIs for the correctable errors, performs the logic operations to correct the errors 818. Upon correction the data word is passed to the system I/O staging buffer 105 and in turn to the computer system data bus 104 in step 819, thereby ending the data fetch operation in step 820.

Alternate implementations of the foregoing invention need not be limited to inclusion of the inventive ECC within a single computer system. For example, those skilled in the art will appreciate that the foregoing ECC could readily be implemented in two or more distinct communicating systems. The data encoding mechanism (i.e. the check bit generation) would occur as previously described within a system that is seeking to transmit data to another remote system (or systems) and the decoding mechanism, including error detection via syndrome bit generation, error location via nibble error indicator bit generation, UE detection and error correction would be implemented (in a manner that has been previously detailed) in the remote receiving system(s).

Though preferred embodiments have been depicted and described in detail herein, it will be apparent to those skilled in the relevant art, both now and in the future, that various modifications, additions, improvements and enhancements may be made without departing from the spirit of the invention, and these are therefore considered to be within the scope of the invention defined in the following claims, which should be construed so as to maintain the proper protection for the invention first disclosed.

Having thus described our invention in detail, what we claim as new and desire to protect by Letters Patent is as follows:

1. An apparatus for encoding and decoding an incoming data word received from a computer system wherein said incoming data word is to be stored in one or more memory devices and wherein all of said one or more memory devices may have one of a plurality of memory configuration types, the apparatus comprising:
   a memory configuration indicator for indicating the memory configuration type for all of the one or more memory devices;
   a check bit generation circuit coupled to said memory configuration indicator and capable of coupling to said computer system for receiving said incoming data word, said check bit generation circuit encoding said incoming data word by generating a set of check bits, said check bits being generated by one of a plurality of operating modes for said check bit generation circuit, said check bits being based on the contents of the incoming data word and the operating mode of the check bit generation circuit, said operating mode being determined by the memory configuration type indication, said check bit generation circuit capable of coupling to said one or more memory devices and wherein said generated check bits are stored with said incoming data word in said one or more memory devices;
   an error detection circuit capable of coupling to the one or more memory device for receiving said stored encoded data word and said stored check bits, and coupled to said memory configuration type indicator, said error detection circuit decoding said encoded data word to determine if one or more bits included in the data word have been altered said data word being decoded by one of a plurality of decoding modes by said error detection circuit, said decoding being based upon the contents of the encoded data word, and the decoding mode of the error detection circuit, said decoding mode being determined by the memory configuration type indication; and
   an error correction circuit coupled to said error detection circuit and capable of coupling to said one or more memory devices and capable of coupling to said computer system, the error correction circuit receiving an indication from said error detection circuit and correcting the contents of said data word received from said one or more memory devices if said error detection circuit indicates that one or more bits of the data word have been altered, said error correction circuit capable of restoring one or more altered bits in the data word to their original values and passing said corrected data word to the computer system.

2. An apparatus according to claim 1 wherein the computer system
   includes a pre-existing error control mechanism and wherein the incoming data word includes data bits and residual check bits, said residual check bits from said pre-existing error control mechanism.

3. An apparatus according to claim 2 wherein the data word includes 2(n)+1 bytes, wherein n is a positive integer.

4. An apparatus according to claim 2 wherein said error detection circuit includes a second check bit generation circuit, said second check bit generation circuit regenerating said check bits for said stored data word if said stored data word is received by the error detection circuit from said one or more memory devices.

5. An apparatus according to claim 4 wherein said error detection circuit compares the generated check bits stored with said data word to said regenerated check bits generated by said second check bit generator to generate a set of syndrome bits for indicating if one or more bits of the data word have been altered.

6. An apparatus according to claim 5 wherein said error detection circuit includes error location logic for localizing the altered one or more bits of the data word, said error location logic receiving said syndrome bits to determine the location of the detected one or more altered bits.

7. An apparatus according to claim 6 wherein the error location logic identifies each data nibble within the data word including the detected one or more altered bits.

8. An apparatus according to claim 7 wherein the locations of the identified data nibbles are provided by said error detection circuit to said error correction circuit for performing logic operations to restore said detected one or more altered bits to their original values.

9. An apparatus according to claim 8 wherein the error correction circuit includes a set of error correcting data nibbles, each of said error correcting data nibbles corresponding to one or more of the data nibbles comprising the data word and wherein the error correcting circuit combines the error correcting data nibbles with the corresponding data nibbles in the data word which inlcude the one or more altered bits in exclusive or operations to restore the one or more altered bits within the data nibbles to their original values.

10. An apparatus according to claim 7 further including:
an uncorrectable error detection unit coupled to the error detection circuit and coupled to the memory configuration indicator, said uncorrectable error detection unit receiving an error indication from said error detection unit if one or more bits of the data word have been altered and receiving a signal from the memory configuration indicator indicating the memory configuration type for all of the one or more memory devices, said uncorrectable error detection unit detecting, based upon the received error codes and the memory configuration type, if said altered one or more bits in the data word may be restored to their original values;
and wherein said uncorrectable error detection unit may be coupled to said computer system for signalling the presence of an uncorrectable error in said data word if said one or more altered bits in the data word may not be restored to their original values.

11. An apparatus according to claim 10 wherein the uncorrectable error detection unit includes logic means responsive to the memory configuration indicator signal for ascertaining the memory configuration type of all of said one or more memory devices and wherein the uncorrectable error detection unit implements a first operating mode if the apparatus is coupled to said one or more memory devices having a first memory configuration type and wherein said uncorrectable error detection unit implements a second operating mode if the apparatus is coupled to said one or more memory devices having a second memory configuration type.

12. An apparatus according to claim 10 wherein if said altered one or more bits of said data word are stored in a plurality of said memory devices, said altered one or more bits are detected by said uncorrectable error detection unit as uncorrectable errors.

13. An apparatus according to claim 10 wherein if the locations of any of the one or more altered bits detected by said error detection unit are not identified by said error location unit, the one or more altered bits are detected by said uncorrectable error detection unit as uncorrectable errors.

14. An apparatus according to claim 10 wherein said signalling of said uncorrectable error by said uncorrectable error detection unit is provided to said pre-existing error control mechanism of said computer system.

15. An apparatus according to claim 1 wherein said data word includes 72 bits and wherein 12 of said check bits are generated by said check bit generation circuit if coupled to said one or more memory devices having four data bits per memory device and wherein 16 of said check bits are generated by said check bit generation circuit if coupled to said one or more memory devices having eight data bits per memory device.

16. An apparatus according to claim 1 wherein the check bit generation circuit is based upon a parity check matrix for encoding said data word with said check bits.

17. An apparatus according to claim 1 wherein the check bit generation circuit includes means for determining the memory configuration type of the one or more memory devices and wherein said encoding of said data word is accomplished via a first parity check matrix if the memory devices are of a first memory configuration type and wherein said encoding of said data word is accomplished via a second parity check matrix if the memory devices are of a second memory configuration type.

18. An apparatus according to claim 17 wherein the data word includes 72 bits and wherein the check bit generation circuit generates 12 check bits if said memory configuration type is four bits per memory device and wherein the check bit generation circuit generates 16 check bits if the memory configuration type is eight bits per memory chip.

19. An apparatus according to claim 17 wherein the error detection circuit is capable of decoding said encoded data word in accordance with said first parity check matrix if said memory devices are of said first memory configuration type or said second parity check matrix if said memory devices are of said second memory configuration type.

20. An apparatus according to claim 17 wherein said apparatus is capable of correcting any number of bit errors occurring within one of said one or more memory devices.

21. An apparatus according to claim 1 wherein said apparatus is incorporated into an application specific integrated circuit.

22. An apparatus according to claim 1 wherein said apparatus is included on a dual in-line memory module with said one or more memory devices.

23. A method for encoding and decoding an incoming data word received from a computer system and wherein said incoming data word is to be stored in one or more memory devices and wherein all of said one or more memory devices may have one of a plurality of memory configuration types, the method comprising the steps of:
indicating the memory configuration type for all of the one or more memory devices;
encoding said incoming data word by generating a set of check bits, said generating of said check bits being performed in one of a plurality of operating modes, said check bits being based upon the contents of the incoming data word and said operating mode, said operating mode being based upon the indicated memory configuration type;
appending said generated check bits with said incoming data word for storage in said one or more memory devices;
retrieving said stored encoded data word and said stored check bits;
decoding said retrieved encoded data word to determine if one or more bits included in the data word have been altered, said decoding being performed in one of a plurality of decoding modes, said decoded data word being based upon the contents of the encoded data word and the decoding mode said decoding mode being based upon the indicated memory configuration type; and
correcting the contents of said data word received from said one or more memory devices if one or more of the bits of the data word have been altered by restoring the one or more altered bits in the data word to their original values.

24. A method according to claim 23 wherein said decoding step further includes the steps of:
regenerating a new set of check bits for said retrieved stored data word;

comparing the check bits stored with said data word to said regenerated check bits for said retrieved stored encoded data word; and generating a set of syndrome bits for indicating if any of said one or more bits in the data word have been altered.

25. A method according to claim 23 wherein said decoding step further includes the steps of:

analyzing said syndrome bits to determine the location of the one or more bits in the data word that have been altered;

identifying the location of each data nibble within the data word which includes the one or more altered bits; and indicating that said localized data nibbles including the one or more altered bits are to be corrected.

26. A method according to claim 25 wherein said correcting step further includes the steps of:

providing a set of error correcting data nibbles wherein each of said error correcting data nibbles corresponds to one or more of the data nibbles of the data word;

combining the appropriate error correcting data nibbles with the corresponding localized data nibbles in the data word which are indicated to include the one or more bit errors, in an exclusive or logic operation to correct the data word.

27. A method according to claim 25 further comprising the steps of:

determining whether said one or more altered bits in said data word are uncorrectable errors; and signalling the computer system if it is determined that the data word includes an uncorrectable error.

28. A method according to claim 27 wherein said determining step further includes the steps of:

receiving the locations of said data nibbles in the data word which include the one or more bit errors;

determining the memory configuration type of the one or more memory devices wherein said memory devices may all be of a first memory configuration type or said memory devices may all be of a second memory configuration type;

implementing a first uncorrectable error detection operation if the memory devices are of a first memory configuration type; and implementing a second uncorrectable error detection operation if the memory devices are of a second memory configuration type.

29. A method according to claim 28 wherein if said one or more altered bits reside on a plurality of said one or more memory devices, said one or more altered bits are determined to be uncorrectable errors.

30. A method according to claim 29 wherein if the data nibble locations of any of the one or more altered bits are not identified by said identifying step said one or more altered bits are determined to be uncorrectable errors.

* * * * *